(12) United States Patent
Cho et al.

(10) Patent No.: US 7,277,138 B2
(45) Date of Patent: Oct. 2, 2007

(54) ARRAY SUBSTRATE FOR LCD DEVICE HAVING DOUBLE-LAYERED METAL STRUCTURE AND MANUFACTURING METHOD THEREOF

(75) Inventors: Won-Ho Cho, Gyeongsangbuk-do (KR); Gyoo-Chul Jo, Gunpo-si (KR); Gue-Tai Lee, Gyeongsangbuk-do (KR); Jin-Gyu Kang, Icheon (KR); Beung-Hwa Jeong, Gyeongsangbuk-do (KR); Jin-Young Kim, Incheon (KR)

(73) Assignee: LG.Philips LCD Co., Ltd., Seoul (KR)

( * ) Notice: Subject to any disclaimer, the term of this patent is extended or adjusted under 35 U.S.C. 154(b) by 535 days.

(21) Appl. No.: 10/878,516

(22) Filed: Jun. 29, 2004

(65) Prior Publication Data

US 2004/0263746 A1    Dec. 30, 2004

(30) Foreign Application Priority Data

Jun. 30, 2003    (KR) .................... 10-2003-0043947

(51) Int. Cl.
*G02F 1/136*    (2006.01)
*H01L 69/04*    (2006.01)

(52) U.S. Cl. .......................... 349/46; 257/59
(58) Field of Classification Search .................. 349/43, 349/46, 187; 257/59, 72
See application file for complete search history.

(56) References Cited

U.S. PATENT DOCUMENTS

| | | | | |
|---|---|---|---|---|
| 5,334,860 | A | * | 8/1994 | Naito ........................ 257/59 |
| 6,008,869 | A | * | 12/1999 | Oana et al. ................. 349/43 |
| 6,404,473 | B1 | * | 6/2002 | Kaneko et al. ............. 349/139 |
| 2001/0030717 | A1 | * | 10/2001 | Kaneko et al. ............. 349/43 |
| 2002/0180900 | A1 | * | 12/2002 | Chae et al. ................. 349/43 |
| 2004/0263708 | A1 | * | 12/2004 | Cho et al. .................... 349/43 |

* cited by examiner

*Primary Examiner*—Toan Ton
(74) *Attorney, Agent, or Firm*—McKenna Long & Aldridge LLP

(57) ABSTRACT

An array substrate for a liquid crystal display device includes a gate electrode, a gate line and a gate pad electrode disposed on a substrate, each of the gate electrode, the gate line and the gate pad electrode having a first metal barrier layer, a first copper alloy layer, and a first out-diffusion film, and the first out-diffusion film completely covering, surrounding and contacting entire surfaces of the first copper alloy layer. The array substrate includes a gate insulation layer disposed on the substrate and covering the gate electrode, the gate line and the gate pad electrode. An active layer and an ohmic contact layer are sequentially formed on the gate insulation layer and over the gate electrode. A data line is formed on the gate insulation layer and perpendicularly crosses the gate line. A source electrode and a drain electrode contact the ohmic contact layer.

30 Claims, 32 Drawing Sheets

ARRAY SUBSTRATE FOR LCD DEVICE HAVING DOUBLE-LAYERED METAL STRUCTURE AND MANUFACTURING METHOD THEREOF

The present invention claims the benefit of Korean Patent Application No. 2003-0043947, filed in Korea on Jun. 30, 2003, which is hereby incorporated by reference.

BACKGROUND OF THE INVENTION

1. Field of the Invention

The present invention relates to a liquid crystal display (LCD) device, and more particularly, to an array substrate having a double-layered metal structure.

2. Discussion of the Related Art

In general, flat panel display devices are increasingly being used as displays for portable devices because they are thin, lightweight, and have low power consumption. Among the various types of flat panel display devices, liquid crystal display (LCD) devices are widely used for laptop computers and desktop monitors because of their superior resolution, color display capabilities and image quality. The liquid crystal display (LCD) devices have wide application in office automation (OA) and video equipment. Among the different types of LCD devices, active matrix LCDs (AM-LCDs), which have thin film transistors and pixel electrodes arranged in a matrix form, offer higher resolution and superior moving image display.

LCD devices use the optical anisotropy and polarization properties of liquid crystal molecules to produce a desired image. Liquid crystal molecules have a definite inter-molecular orientation that results from their peculiar characteristics. Due to optical anisotropy, incident light is refracted according to the orientation of the liquid crystal molecules. The specific orientation can be modified by applying an electric field across the liquid crystal molecules. In other words, an electric fields applied across the liquid crystal molecules can change the orientation of the liquid crystal molecules.

A typical LCD panel has an upper substrate, a lower substrate with electrodes spaced apart and facing each other. A liquid crystal material layer is interposed between the upper and lower substrates. The upper substrate, commonly referred to as a color filter substrate, includes a common electrode and color filters. The lower substrate, commonly referred to as an array substrate, includes switching elements, such as thin film transistors (TFT's), and pixel electrodes.

When a voltage is applied to the liquid crystal material through the electrodes corresponding to each substrate, an alignment direction of the liquid crystal molecules is changed in accordance with the applied voltage to display images. By controlling the applied voltage, the LCD device provides various transmittances for rays of light to display image data.

As previously described, operation of an LCD device is based on the principle that the alignment direction of the liquid crystal molecules is dependent upon an applied electric field between the common electrode and the pixel electrode. Accordingly, the liquid crystal molecules function as an optical modulation element having variable optical characteristics that depend upon a polarity of the applied voltage.

FIG. 1 is a partially enlarged plan view of an array substrate according to the related art. As shown, gate lines 33 are disposed in a transverse direction and data lines 53 are disposed in a longitudinal direction. The data lines 53 perpendicularly cross the gate lines 33 such that the crossing of the gate and data lines 33 and 53 defines a matrix of pixel regions P. A switching device such as a thin film transistor T is disposed in each pixel region P adjacent to a crossing of the gate and data lines 33 and 53. A gate pad electrode 35 is formed adjacent to the end of each gate line 33. The gate pad electrode 35 is wider than the gate line 33. A data pad electrode 55 is formed adjacent to the end of each data line 53, and similarly is wider than the data line 53. A gate pad terminal 71 is formed on each gate pad electrode 35. The gate [ad terminal is made of a transparent and electrically conductive material. A data pad terminal 73 of transparent conductive material is likewise formed on each data pad electrode 55. The gate and data pad terminals 71 and 73 receive electrical signals from the external driving circuits.

A pixel electrode 69 is disposed in each pixel region P and contacts the thin film transistor T. A storage capacitor $C_{ST}$ is also formed in a portion of each pixel region P. In each pixel region P in this embodiment of the present invention, the storage capacitor $C_{ST}$ is formed over the gate line 33 and is connected in parallel with the pixel electrode 69.

Each thin film transistor T includes a gate electrode 31 extending from the gate line 33, an active layer 39 formed of silicon, a source electrode 49 extending from the data line 53, and a drain electrode 51 contacting the pixel electrode 69. Meanwhile, the storage capacitor $C_{ST}$ includes a portion of the gate line 33 as a first electrode, a capacitor electrode 57 as a second electrode, and an insulator (not shown) interposed therebetween. The capacitor electrode 57 is formed of the same material as the source and drain electrodes 49 and 51 and communicates with the pixel electrode 69 through a storage contact hole 63.

In the related art array substrate shown in FIG. 1, the gate electrode 31 and the gate line 33 are generally formed of aluminum or aluminum alloy to prevent signal delay. Furthermore, all of the source electrode 49, the drain electrode 51, the data line 53 and the data pad electrode 55 can also be formed of aluminum or aluminum alloy. Alternatively, such electrodes and data line may be formed of aluminum-included double layers that can be formed of an aluminum (or aluminum-alloy) layer and an additional metal layer because the aluminum or aluminum alloy are chemically weak at etchant and developer during the process.

FIGS. 2A-2F are cross-sectional views of the array substrate along line II-II' of FIG. 1, showing processing steps during fabrication of a thin film transistor and a pixel electrode according to the related art. FIGS. 3A-3F are cross-sectional views of the array substrate along line III-III' of FIG. 1, showing processing steps during fabrication of a gate pad according to the related art. FIGS. 4A-4F are cross-sectional views of the array substrate along IV-IV' of FIG. 1, showing processing steps during fabrication of a data pad according to the related art.

Referring to FIGS. 2A, 3A, and 4A, a first metal layer may be deposited onto a surface of a substrate 21, and then patterned to form a gate line 33, a gate electrode 31, and a gate pad electrode 35 on the substrate 21. As mentioned before, the gate pad electrode 35 may be disposed adjacent to the end of the gate line 33, and the gate electrode 31 may extend from the gate line 33. The first metal layer may be aluminum-based material(s), for example, aluminum (Al) or aluminum neodymium (AlNd), having low electrical resistance to prevent signal delay. Although the aluminum-based material, aluminum (Al) or aluminum-alloy (e.g., aluminum neodymium (AlNd)), has a low electrical resistance, it is chemically weak against the developer and etchant. Specifically, the aluminum included in the gate line 33 reduces the RC (resistive-capacitive) delay because it has a low resistance. However, aluminum is delicate in an acidic environment and susceptible to developing hillocks during a high temperature manufacturing or patterning process, possibly resulting in line defects.

Referring to FIGS. 2B, 3B and 4B, a gate insulation layer 37 (or a first insulating layer) may be formed over the substrate 21 after formation of the gate electrode 31, the gate line 33 and the gate pad electrode 35. The gate insulation layer 37 completely covers the gate electrode 31, the gate line 33 and the gate pad electrode 35. The gate insulation layer 37 may include inorganic material(s), for example, silicon nitride ($SiN_x$) and silicon oxide ($SiO_2$). Then, an intrinsic amorphous silicon layer (e.g., a-Si:H) and a doped amorphous silicon layer (e.g., $n^+$a-Si:H) may be sequentially deposited on an entire surface of the gate insulation layer 37, and may be simultaneously patterned using a mask process to form an active layer 39 and an ohmic contact layer 41. The ohmic contact layer 41 may be located on the active layer 39 over the gate electrode 31.

Referring to FIGS. 2C, 3C and 4C, second to fourth metal layers 43, 45 and 47 are sequentially formed on the gate insulation layer 37 to cover both the active layer 39 and the ohmic contact layer 41. Here, the second and fourth metal layers 43 and 47 are molybdenum (Mo), and the third metal layer 45 interposed therebetween is aluminum (Al). Therefore, the triple-layered structure of Mo/Al/Mo is disposed on the gate insulation layer 37.

Referring to FIGS. 2D, 3D and 4D, the second to fourth metal layers 43, 45 and 47 are thereafter simultaneously patterned. Thus, a source electrode 49, a drain electrode 51, a data line 53, a data pad electrode 55 and a capacitor electrode 57, each of which has the triple-layered structure, are formed over the substrate 21. The source electrode 49 extends from the data line 53 and contacts one portion of the ohmic contact layer 41. The drain electrode 51 is spaced apart from the source electrode 49 across the gate electrode 31, and contacts the other portion of the ohmic contact layer 41. As mentioned with reference to FIG. 1, the data pad electrode 55 is adjacent to the end of the data line 53, and the capacitor electrode 57 is shaped like an island and disposed above the gate line 33. After forming the source and drain electrodes 49 and 51, a portion of the ohmic contact layer 41 located between the source and drain electrodes 49 and 51 is removed to form a channel region. At this time of forming the channel region, the source and drain electrodes 49 and 51 serve as masks.

The source and drain electrodes 49 and 51 and the data line 53 can be formed of a single layer of molybdenum or chromium. However, doing so may result in signal delay in those electrodes and data line such that it is hard to obtain uniform image quality over the entire liquid crystal panel. Especially, if the liquid crystal panel increases in size, the signal delay becomes more and more significant and difficult to overcome.

In contrast, when the source and drain electrodes 49 and 51 and the data line 53 include a low resistance metal, such as aluminum, the electrical signals flow without incurring signal delays. So, a larger size array substrate can be fabricated. Therefore, the source and drain electrodes 49 and 51 and the data lines 53 herein include the aluminum layer therein. Further, when aluminum is used for the source and drain electrodes 49 and 51, the molybdenum layers are formed on both upper and lower surfaces of the aluminum layer. The second metal of molybdenum formed underneath the aluminum layer prevents a spiking phenomenon in which the aluminum layer penetrates into the active layer 39 or the ohmic contact layer 41. The fourth metal of molybdenum formed on the aluminum layer reduces a contact resistance between the aluminum layer and a later-formed transparent electrode. For these reasons, the source and drain electrodes 49 and 51 and the data line 53 are formed in the triple-layered structure of Mo/Al/Mo.

Referring to FIGS. 2E, 3E and 4E, a passivation layer 59, which is a second insulating material, is formed over the entire substrate 21 covering the source and drain electrodes 49 and 51, the data line 53, the data pad electrode 55 and the storage capacitor 57. Thereafter, the passivation layer 59 is patterned to form a drain contact hole 61, a storage contact hole 63, a gate pad contact hole 65, and a data pad contact hole 67. The drain contact hole 61 exposes a portion of the triple-layered drain electrode 51, the storage contact hole 63 exposes a portion of the triple-layered capacitor electrode 57, the gate pad contact hole 65 exposes a portion of the triple-layered gate pad electrode 35, and the data pad contact hole 67 exposes a portion of the triple-layered data pad electrode 55.

Referring to FIGS. 2F, 3F and 4F, a transparent conductive material is deposited on the passivation layer 59 having the above-mentioned holes, and then this transparent conductive material is patterned to form a pixel electrode 69, a gate pad terminal 71 and a data pad terminal 73. The transparent conductive material is one of indium tin oxide (ITO) and indium zinc oxide (IZO). The pixel electrode 69 contacts the drain electrode 51 and the capacitor electrode 57, respectively, through the drain contact hole 61 and storage contact hole 63. Further, the gate pad terminal 71 contacts the gate pad electrode 35 through the gate pad contact hole 65, and the data pad terminal 73 contacts the data pad electrode 55 through the data pad contact hole 67. Accordingly, the array substrate of the related art is complete.

In the related art shown in FIGS. 2A-2F, 3A-3F and 4A-4F, the source and drain electrodes 49 and 51, the data line 53 and the data pad electrode 55, each of which has the triple-layered structure, are formed by an etching solution that simultaneously etches aluminum and molybdenum. Thus, an electrochemical reaction, such as a Galvanic Reaction, will be generated by the etching solution during this etching process. As the molybdenum layer becomes thicker, it is much difficult to overcome the problem of electrochemical reaction. During the etching process of patterning the second to fourth metal layers, the molybdenum layers disposed on the upper and lower surfaces of the aluminum layer are overly etched. Especially, if the second layer of molybdenum underneath the third layer of aluminum is overly etched, the third aluminum layer collapses and contacts the active layer in the thin film transistor when the passivation layer is formed over them. The collapse and contact are caused by the pressure of the overlying passivation layer during the formation of the passivation layer. The electrical connection between the aluminum layer and the active layer will increase the leakage current and deteriorate the operating characteristics of the thin film transistor.

FIG. 5 is an enlarged cross-sectional view of portion A from FIG. 2F, illustrating an overetching in the second and fourth metal layers of the drain electrode according to the related art. As shown in a portion E of FIG. 5, the molybdenum layers 43 and 47 are overly etched rather than the aluminum layer 45. This phenomenon of overetching also occurs in the source electrode 51, the data line 53 and the data pad electrode 55. The overetching of the molybdenum layers 43 and 47 causes the passivation layer 59 to be malformed over the substrate 21. Furthermore, the overetching of the molybdenum layer 43 causes the aluminum layer 45 to contact the active layer 39 and/or the ohmic contact layer 41 because the aluminum layer 45 is pressed by the passivation layer 59, thereby increasing the leakage current in the thin film transistor. The increase of the OFF current deteriorates the electrical characteristics of the thin film transistor.

SUMMARY OF THE INVENTION

Accordingly, the present invention is directed to an array substrate for a liquid crystal display (LCD) device, that substantially obviates one or more of problems due to limitations and disadvantages of the related art.

An object of the present invention is to provide an array substrate with a reduced leakage current in the thin film transistors of a liquid crystal device.

Another object of the present invention is to provide a method of forming an array substrate, which simplifies and stabilizes manufacturing processes and increases manufacturing yield for a liquid crystal display device.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the array substrate for a liquid crystal display device includes a gate electrode, a gate line and a gate pad electrode disposed on a substrate, each of the gate electrode, the gate line and the gate pad electrode having a first metal barrier layer, a first copper alloy layer, and a first out-diffusion film, and the first out-diffusion film completely covering, surrounding and contacting entire surfaces of the first copper alloy layer. The array substrate includes a gate insulation layer disposed on the substrate and covering the gate electrode, the gate line and the gate pad electrode. An active layer and an ohmic contact layer are sequentially formed on the gate insulation layer and over the gate electrode. A data line is formed on the gate insulation layer and perpendicularly crosses the gate line. A source electrode and a drain electrode contact the ohmic contact layer. A data pad electrode is disposed on the gate insulation layer. A passivation layer is formed on the gate insulation layer, the passivation layer covering the data line, the source electrode and the drain electrode, and the data pad electrode, and the passivation layer having a plurality of contact holes, including a drain contact hole that exposes a portion of the drain electrode, a gate pad contact hole that exposes a portion of the gate pad electrode, and a data pad contact hole that exposes a portion of the data pad electrode. The array substrate further includes a pixel electrode, a gate pad terminal and a data pad terminal, each of which is formed on the passivation layer, and each of which includes a transparent conductive material.

In another aspect, the method of forming an array substrate for a liquid crystal display device includes forming a gate electrode, a gate line and a gate pad electrode on a substrate, each of the gate electrode, the gate line and the gate pad electrode including a first metal barrier layer and a first copper alloy layer arranged in a first double-layered structure; applying heat to the gate electrode, the gate line and the data pad electrode, thereby forming a first out-diffusion film covering, surrounding and contacting entire surfaces of the first copper alloy layer corresponding to each of the gate electrode, the gate line and the data pad electrode; forming a gate insulation layer on the substrate, the gate insulation layer covering the gate electrode, the gate line and the gate pad electrode including the first metal barrier layer, the first copper alloy layer and the first out-diffusion film corresponding to each of the gate electrode, the gate line and the gate pad electrode; sequentially forming an active layer and an ohmic contact layer on the gate insulation layer and over the gate electrode; forming a data line, a source electrode, a drain electrode and a data pad electrode, such that the data line is disposed on the gate insulation layer and crosses the gate line, the source electrode and the drain electrode contact the ohmic contact layer, the data pad electrode is disposed on the gate insulation layer, and each of the data line, the source electrode, the drain electrode, the data pad electrode includes a second metal barrier layer and a second copper alloy layer arranged in a second double-layered structure; forming a second out-diffusion film by applying heat to the data line, the source electrode and the drain electrode and the data pad electrode, the second out-diffusion film covering, surrounding and contacting the second copper alloy layer in each of the data line, the source electrode and the drain electrode and the data pad electrode; forming a passivation layer on the gate insulation layer to cover the data line, the source electrode and the drain electrode, and the data pad electrode, including the second metal barrier layer, the second copper alloy layer and the second out-diffusion film corresponding to each of which, such that the passivation layer includes a plurality of contact holes, including a drain contact hole that exposes the drain electrode, a gate pad contact hole that exposes the gate pad electrode, and a data pad contact hole that exposes the data pad electrode; and forming a pixel electrode, a gate pad terminal and a data pad terminal on the passivation layer using a transparent conductive material.

In another aspect, the method of forming an array substrate for a liquid crystal display device includes forming a double-layered electrode, which is one of a gate electrode, a gate line and a gate pad electrode on a substrate, such that the double-layered electrode includes a first metal barrier layer and a first copper alloy layer arranged in a first double-layered structure; applying heat to the double-layered electrode, thereby forming a first out-diffusion film covering, surrounding and contacting entire surfaces of the first copper alloy layer; forming a gate insulation layer on the substrate, the gate insulation layer covering the double-layered electrode including the first metal barrier layer, the first copper alloy layer and the first out-diffusion film; sequentially forming an active layer and an ohmic contact layer on the gate insulation layer and over the gate electrode; forming a data line, a source electrode, a drain electrode and a data pad electrode, such that the data line is disposed on the gate insulation layer and crosses the gate line, the source electrode and the drain electrode contact the ohmic contact layer, the data pad electrode is disposed on the gate insulation layer, and one of the data line, the source electrode, the drain electrodes, the data pad electrode includes a second metal barrier layer and a second copper alloy layer arranged in a second double-layered structure; forming a second out-diffusion film by applying heat to the one of the data line, the source electrode and the drain electrode and the data pad electrode that includes the second double-layered structure, the second out-diffusion film covering, surrounding and contacting the second copper alloy layer; forming a passivation layer on the gate insulation layer to cover the data line, the source electrode and the drain electrode, and the data pad electrode, including the second metal barrier layer, the second copper alloy layer and the second out-diffusion film, such that the passivation layer includes a plurality of contact holes, including a drain contact hole that exposes the drain electrode, a gate pad contact hole that exposes the gate pad electrode, and a data pad contact hole that exposes the data pad electrode; and forming a pixel electrode, a gate pad terminal and a data pad terminal on the passivation layer using a transparent conductive material.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to the illustrated embodiments of the present invention, examples of which are illustrated in the accompanying drawings.

Figure 1:
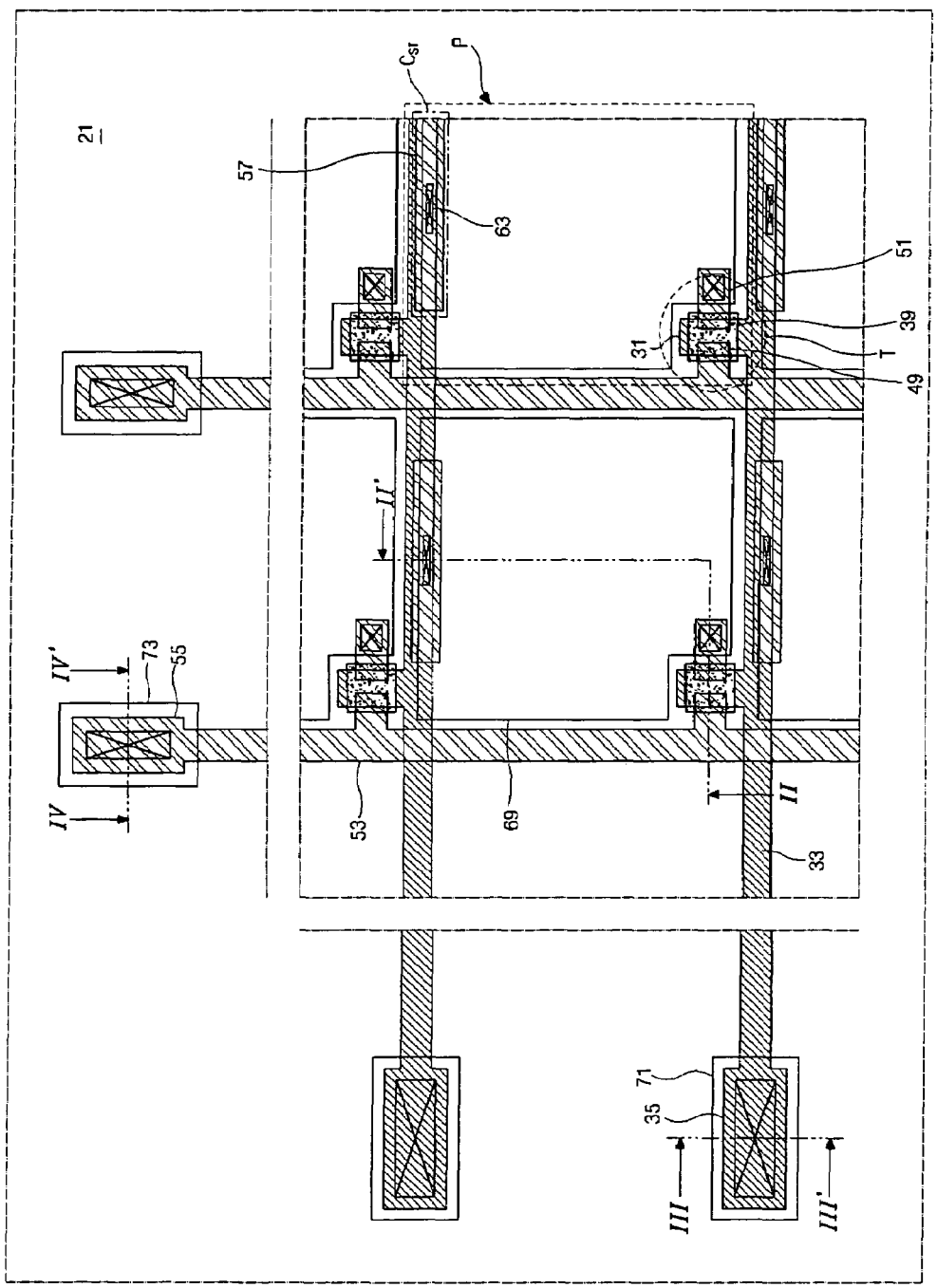
FIG. 1 is a partially enlarged plan view of an array substrate according to the related art.
Figure 2A:
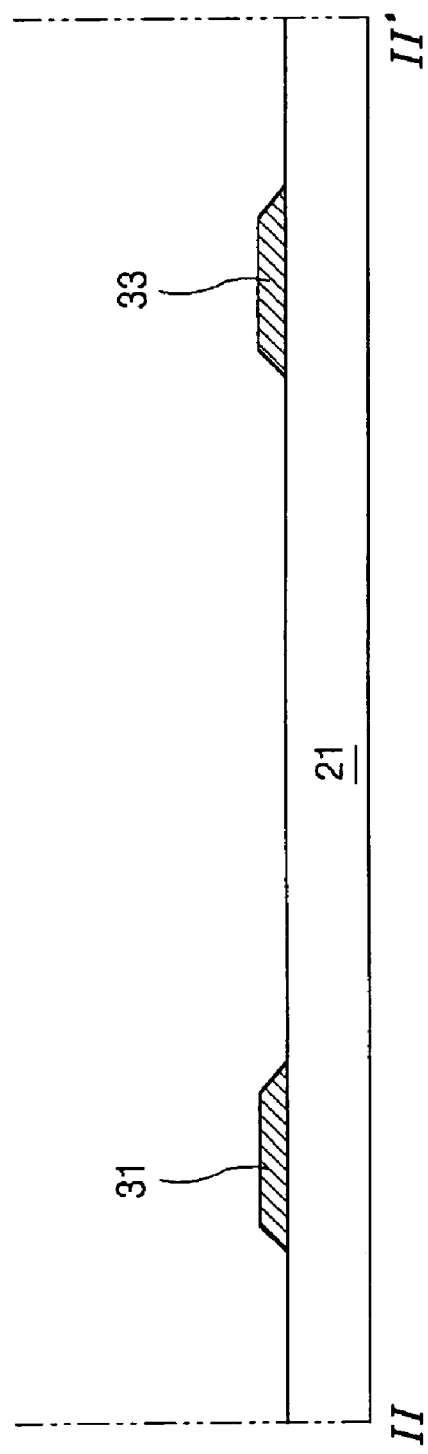
FIGS. 2A-2F are cross-sectional views of the array substrate along line II-II of FIG. 1, showing processing steps during fabrication of a thin film transistor and a pixel electrode according to the related art.
Figure 2B:
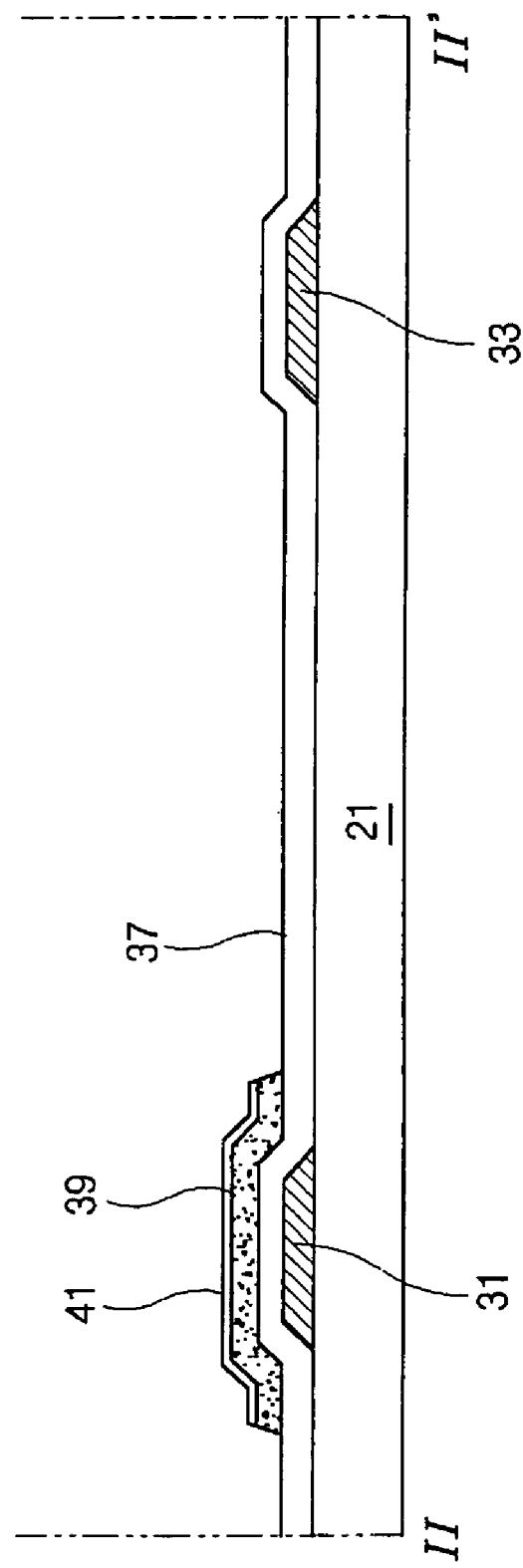
Figure 2C:
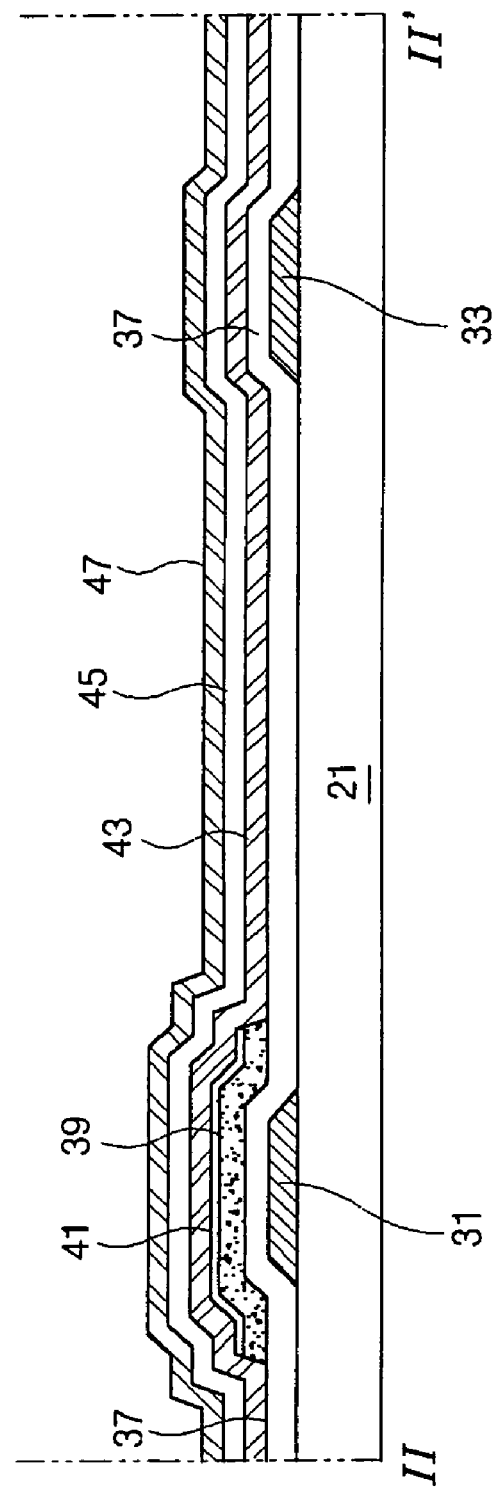
Figure 2D:
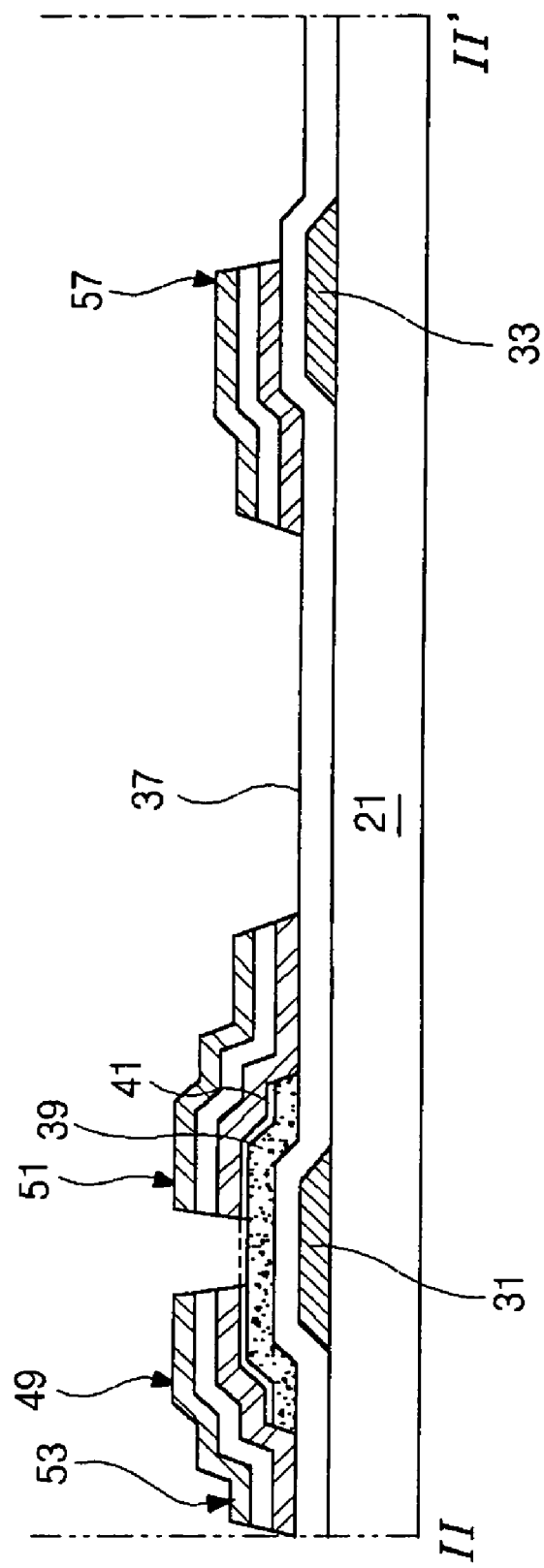
Figure 2E:
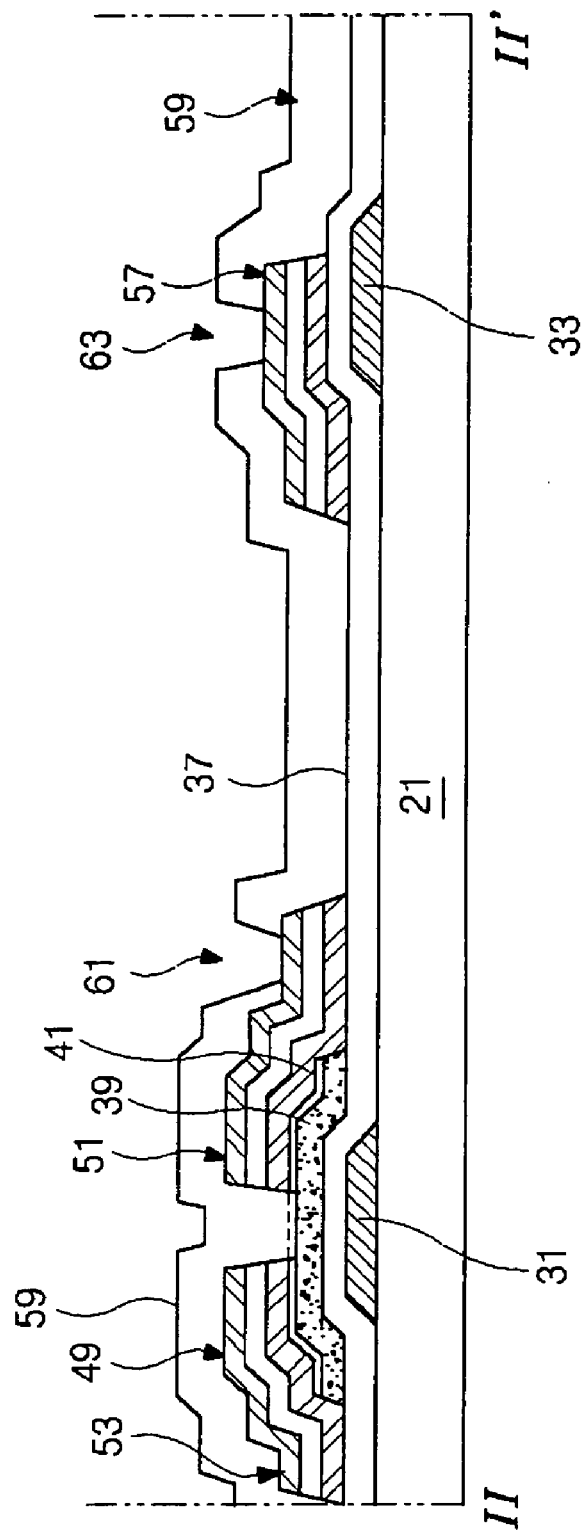
Figure 2F:
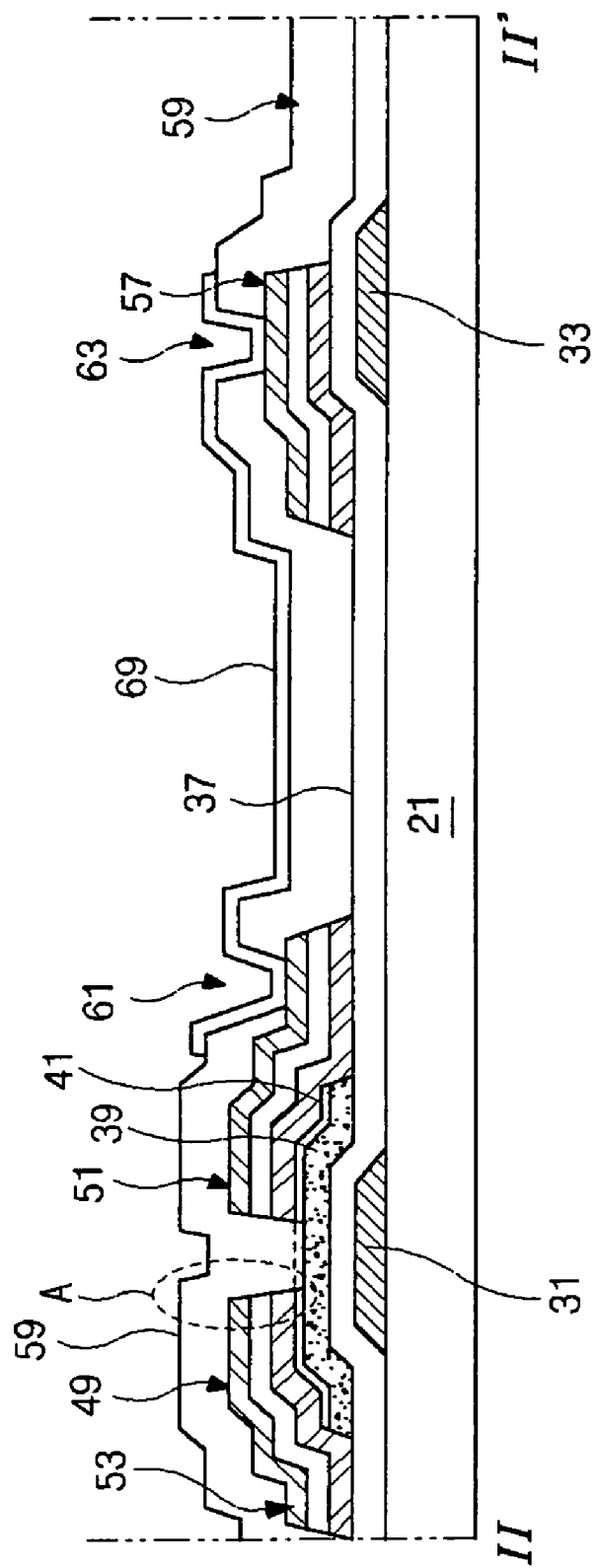
Figure 3A:
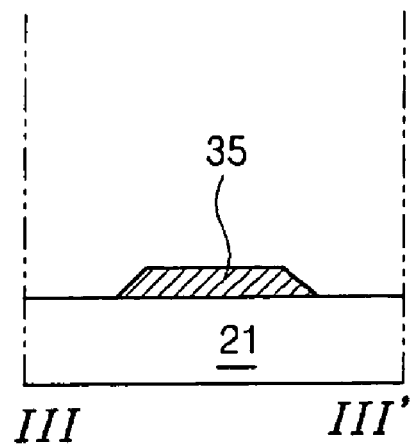
FIGS. 3A-3F are cross-sectional views of the array substrate along line III-III of FIG. 1, showing processing steps during fabrication of a gate pad according to the related art.
Figure 3B:
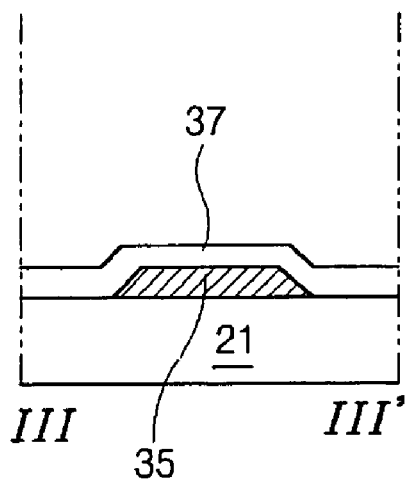
Figure 3C:
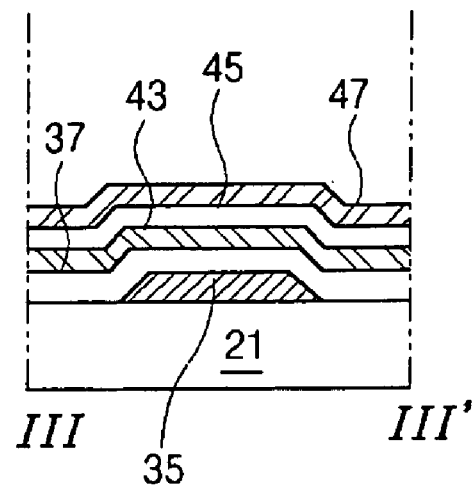
Figure 3D:
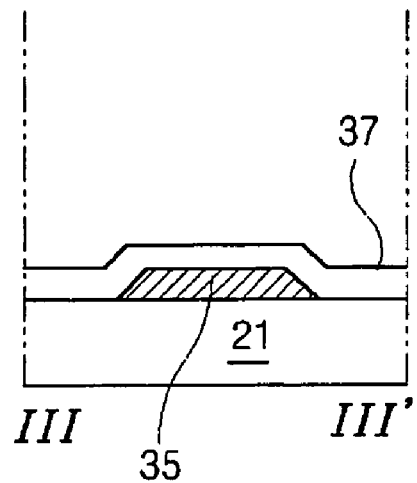
Figure 3E:
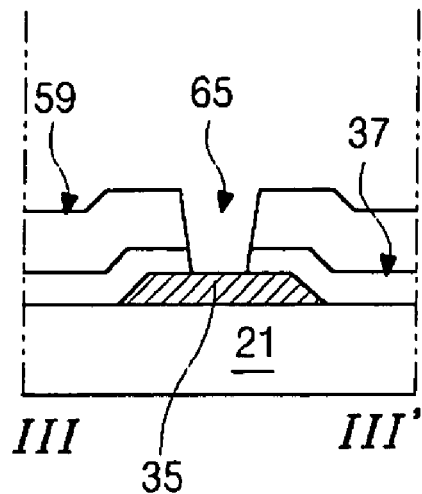
Figure 3F:
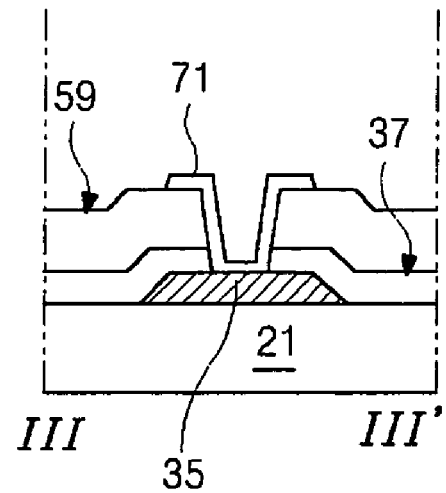
Figure 4A:
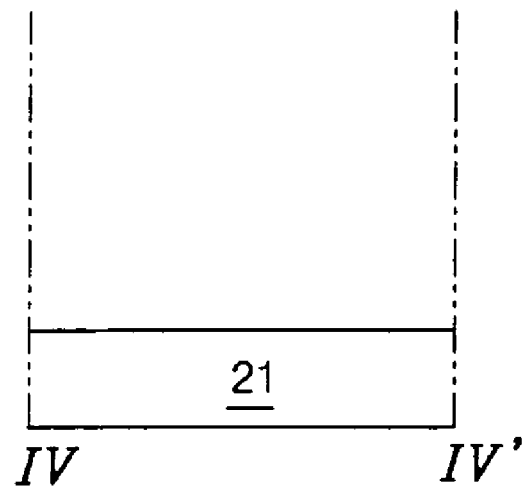
FIGS. 4A-4F are cross-sectional views of the array substrate along IV-IV' of FIG. 1, showing processing steps during fabrication of a data pad according to the related art.
Figure 4B:
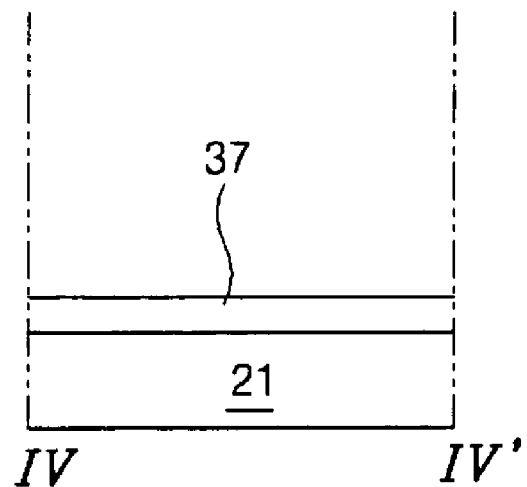
Figure 4C:
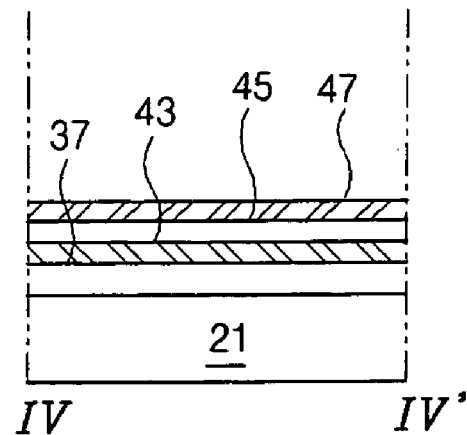
Figure 4D:
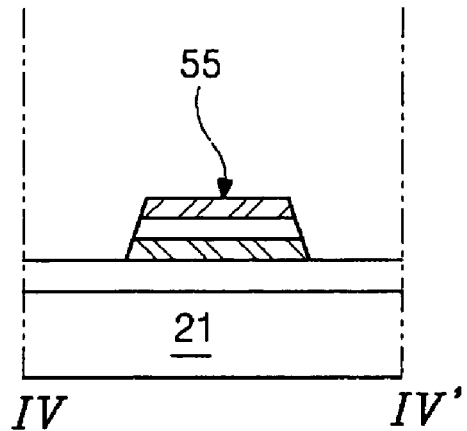
Figure 4E:
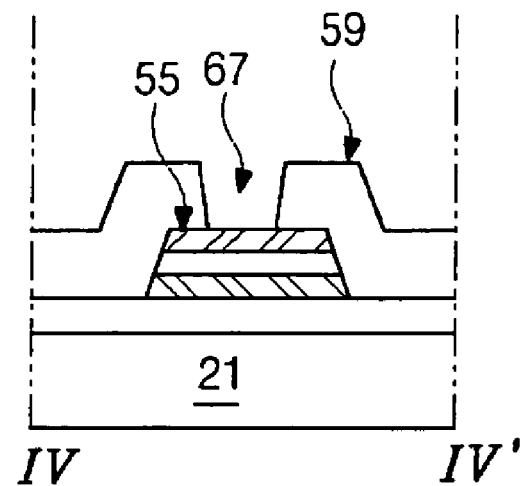
Figure 4F:
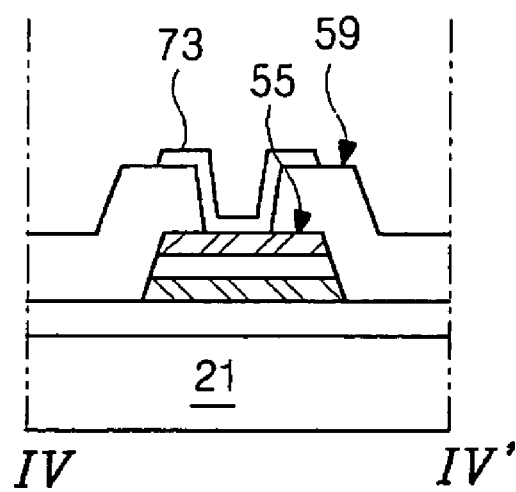
Figure 5:
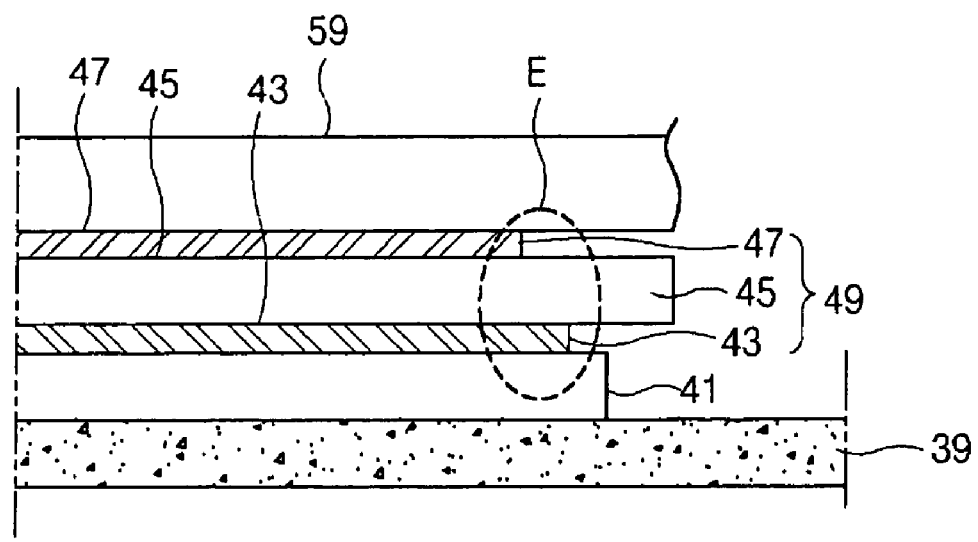
FIG. 5 is an enlarged cross-sectional view of portion A from FIG. 2F, illustrating an overetching in the second and fourth metal layers of the drain electrode according to the related art.

Wherever possible, similar reference numbers will be used throughout the drawings to refer to the same or like parts. The planar view in embodiments of the present invention is similar to FIG. 1, so a separate plan view is not included. Distinctive features in embodiments of the present invention may include multiple layers, such as copper-alloy layers, for the gate, source and drain electrodes and the gate and data lines.

FIGS. 6A to 6H are cross sectional views of an exemplary process of forming a pixel according to an embodiment of the present invention. FIGS. 7A to 7H are cross sectional views of an exemplary process of forming a gate pad according to an embodiment of the present invention. FIGS. 8A to 8H are cross sectional views of an exemplary process of forming a data pad according to an embodiment of the present invention.

Figure 6A:
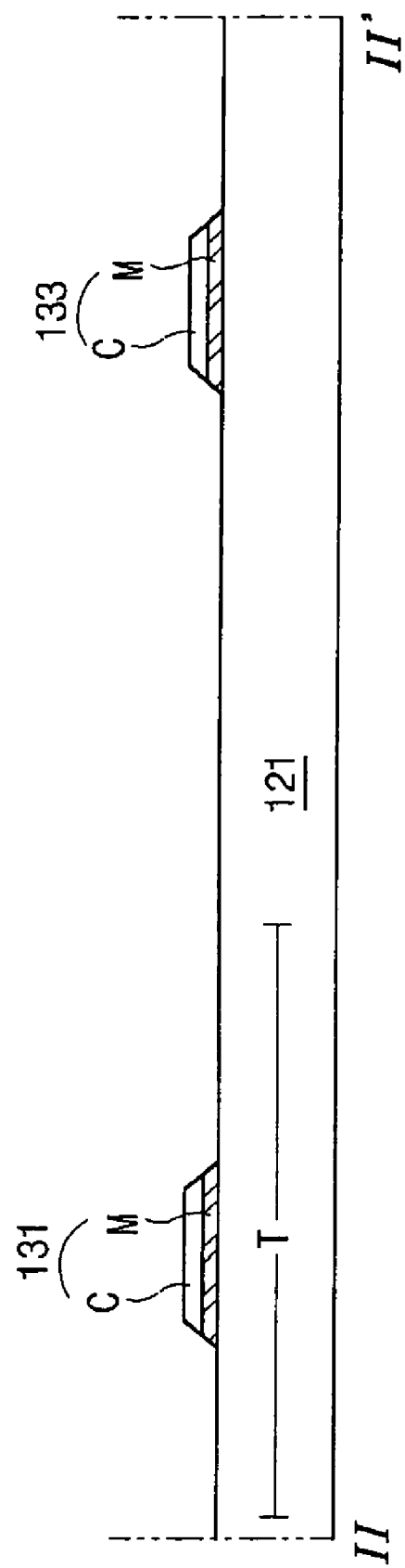
FIGS. 6A to 6H are cross sectional views of an exemplary process of forming a pixel according to an embodiment of the present invention.
Figure 7A:
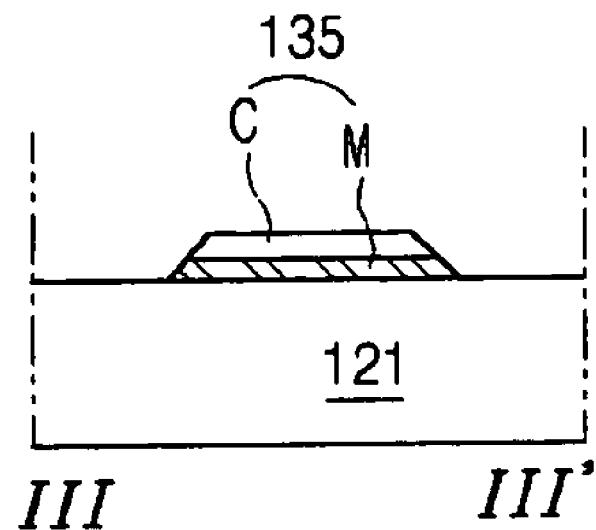
FIGS. 7A to 7H are cross sectional views of an exemplary process of forming a gate pad according to an embodiment of the present invention.
Figure 8A:
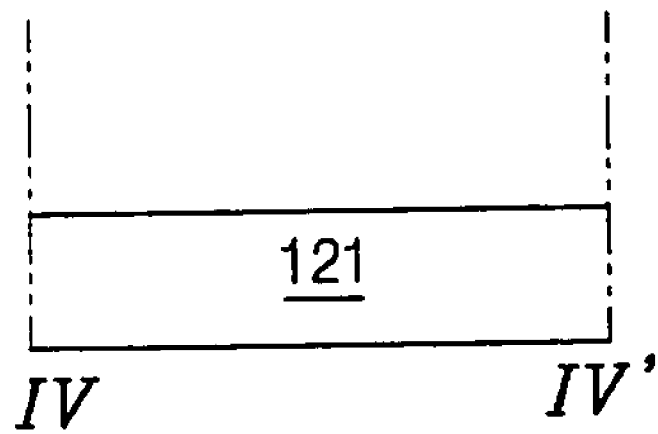
FIGS. 8A to 8H are cross sectional views of an exemplary process of forming a data pad according to an embodiment of the present invention.

Referring to FIGS. 6A, 7A and 8A, a first metal layer M and a second metal layer C are sequentially formed on a substrate 121. The first and second metal layers M and C are simultaneously patterned to form a gate electrode 131, a gate line 133, and a gate pad electrode 135. The first metal layer M may be molybdenum (Mo) or molybdenum alloy (Mo-alloy. The second metal layer C may be copper alloy (Cu-alloy) that may include copper and at least one other metal, which is one of titanium (Ti), tantalum (Ta), chromium (Cr), nickel (Ni), neodymium (Nd), indium (In), aluminum (Al), and an alloy of thereof. The copper alloy layer C holds less than 5% of such other metal because the specific resistance of the copper alloy layer C would otherwise increase to a point where it could not be used as an electrode or a line.

The first metal layer M acts as a metal barrier that helps binding the second metal layer C to the substrate 121. Since the copper alloy layer C does not have good adhesiveness to the substrate 121, the metal barrier M is interposed between the substrate 121 and the copper alloy layer C.

Although not shown in FIGS. 6A, 7A and 8A, the gate line 133 is disposed in a first direction on the substrate 121. The gate electrode 131 extends from the gate line 133. The gate pad electrode 135 is disposed adjacent to an end of the gate line 133. In exemplary embodiments of the present invention, each of the gate electrode 131, the gate line 133 and the pad electrode 135 has a double-layered structure including the first layer M of molybdenum and the second layer C of copper alloy, as shown with reference to FIGS. 6A, 7A and 8A.

Figure 6B:
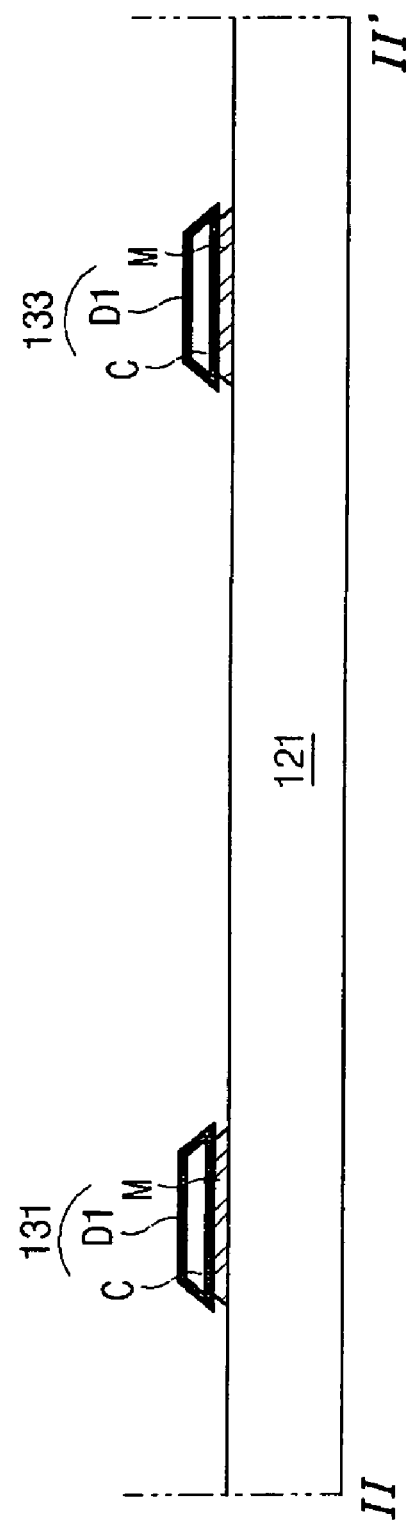
Figure 7B:
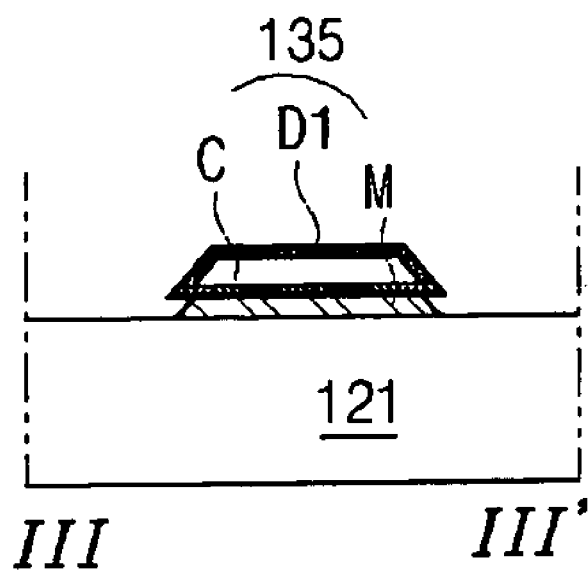
Figure 8B:
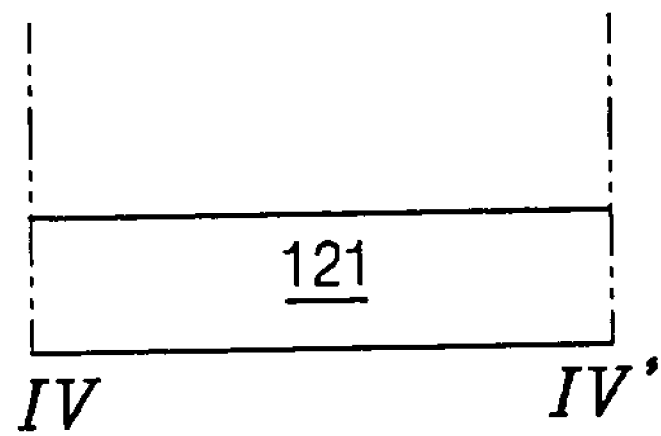

Referring to FIGS. 6B, 7B and 8B, the thus-formed double-layered gate electrode 131, gate line 133 and pad electrode 135, and the substrate 121 underneath, are heat-treated at a temperature of more than 200 decrees Celsius. Therefore, a first out-diffusion film D1 is formed surrounding all surfaces of the second metal layer C of copper alloy. The first out-diffusion film D1 has a thickness of 1 to 100 angstroms. During the heat treatment, the molybdenum included in the first metal layer M diffuses on all of the surfaces of the second metal layer C and then reacts with the copper included in the second metal layer C. As a result, the first out-diffusion film D1 becomes a compound metal film of molybdenum and copper. As shown in FIGS. 6B and 7B, the first out-diffusion film D1 completely covers and surrounds the second layer C. Further, since molybdenum is alloyed with copper, the first out-diffusion film D1 is interposed between the first metal layer M and the second metal layer C.

Figure 6C:
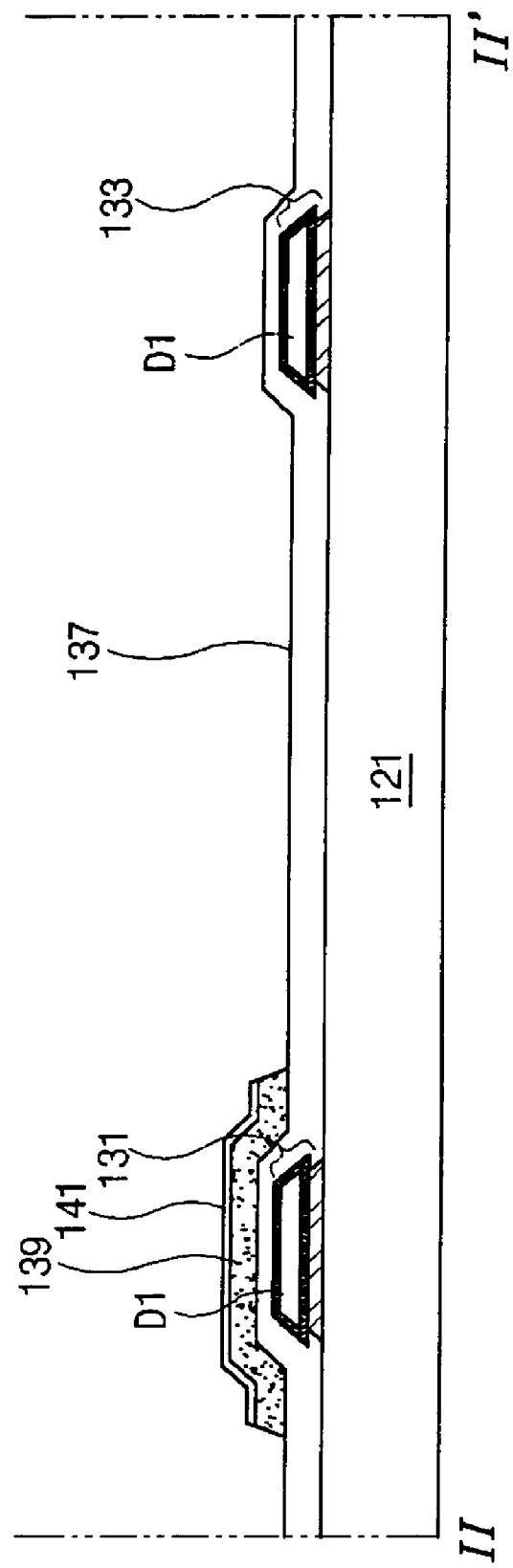
Figure 7C:
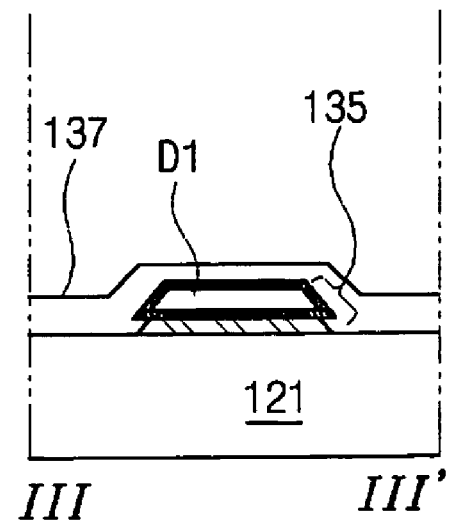
Figure 8C:
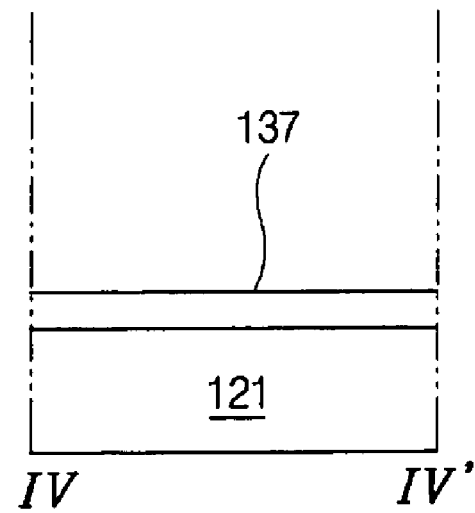

Referring to FIGS. 6C, 7C and 8C, a gate insulation layer 137, which is a first insulating layer, is formed on the substrate 121 to cover the gate electrode 131, gate line 133 and pad electrode 135, all of which include the first out-diffusion film D1. The gate insulation layer 137 is an inorganic material, for example, silicon nitride ($SiN_x$) or silicon oxide ($SiO_2$). Thereafter, amorphous silicon (a-Si:H) and $n^+$ doped amorphous silicon ($n^+$a-Si:H) are sequentially formed on the gate insulation layer 137 and then patterned to form an active layer 139 and an ohmic contact layer 141. The active layer 139 is disposed on the gate insulation layer 137, especially over the gate electrode 13 1. The ohmic contact layer 141 is disposed on the active layer 139.

Figure 6D:
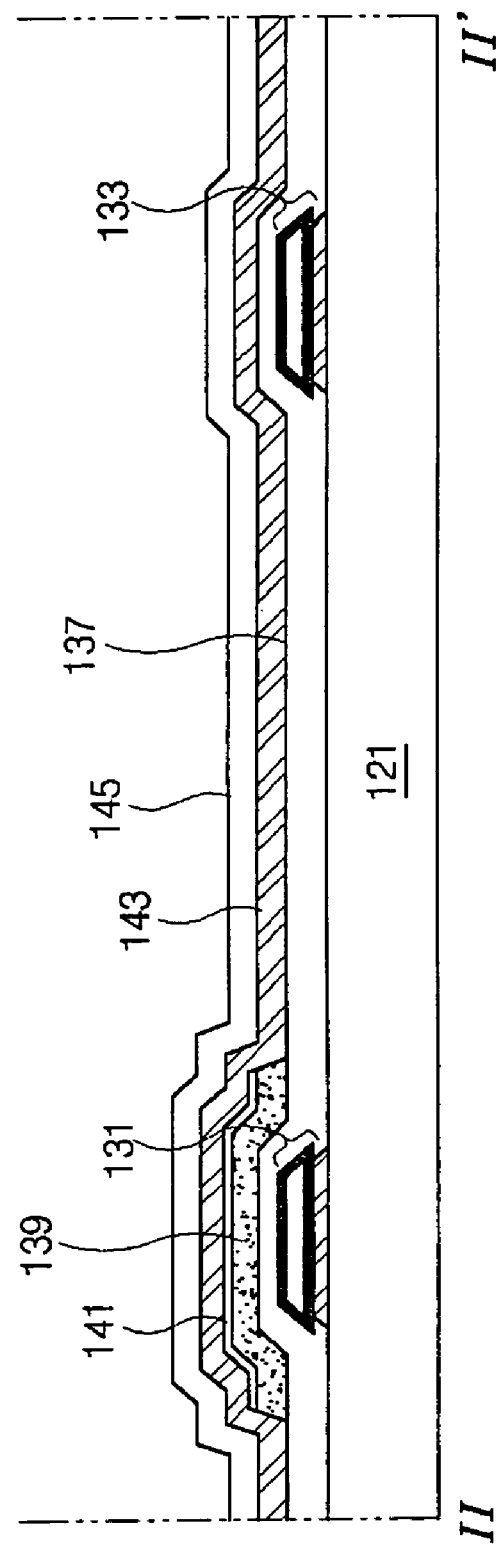
Figure 7D:
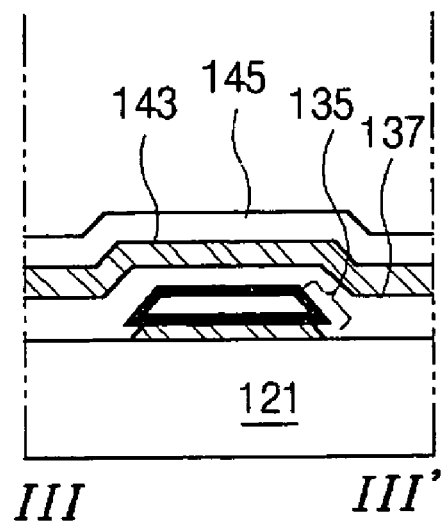
Figure 8D:
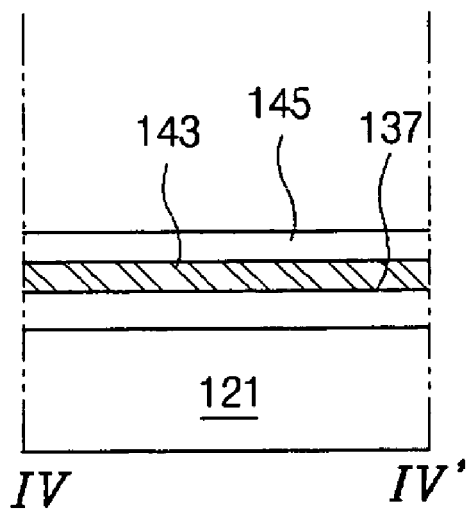

Referring to FIGS. 6D, 7D and 8D, third and fourth metal layers 143 and 145 are sequentially formed on the gate insulation layer 137 to cover both the active layer 137 and the ohmic contact layer 141 and a remaining portion of the gate insulation layer 137. Here, the third metal layer 143 may be molybdenum (Mo) or a molybdenum alloy. Further, the fourth metal layer 145 is copper ally (Cu ally). The third metal layer 143 acts as a metal barrier that prevents the Cu alloy layer 145 from directly contacting the semiconductor layers of active and of ohmic contact layers 139 and 141 because the copper in the Cu alloy layer 145 may react with silicon included in the active layer 139 and ohmic contact layer 141. Thus, the double-layered structure of the molybdenum (or molybdenum alloy) layer 143 and the Cu alloy layer 145 is disposed on the portion of the gate insulation layer 137 that surrounds the active layer region.

Figure 6E:
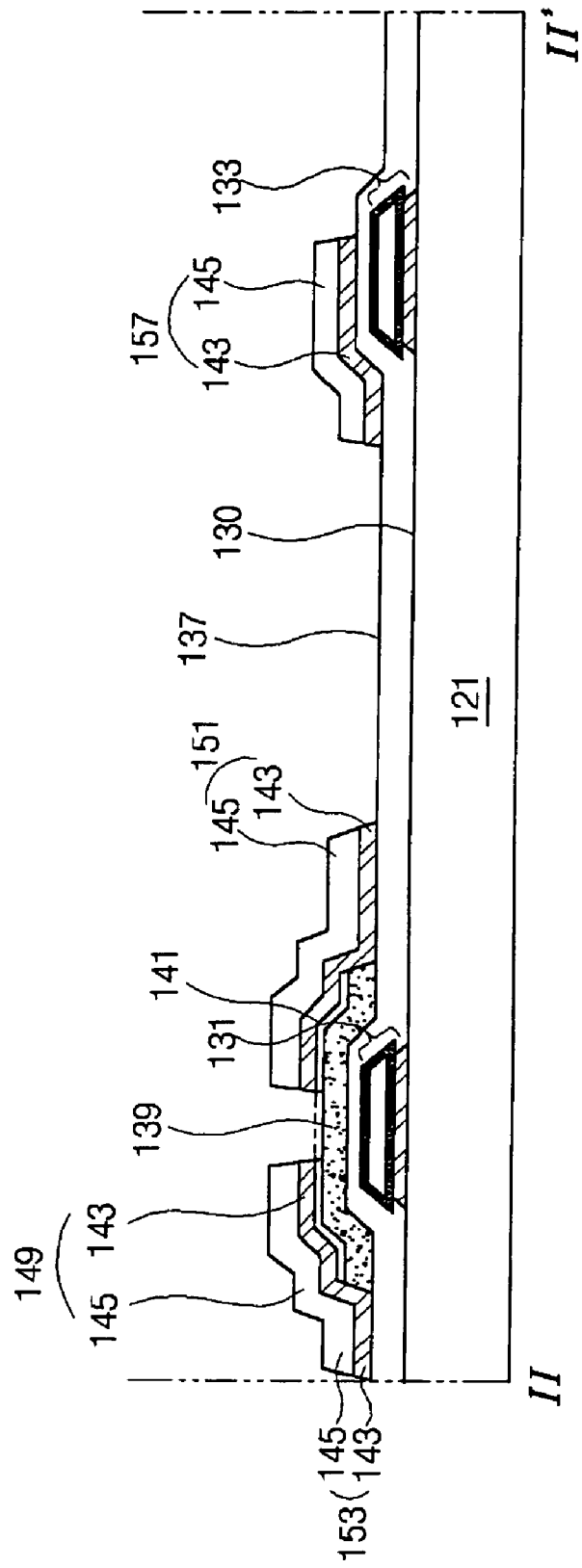
Figure 7E:
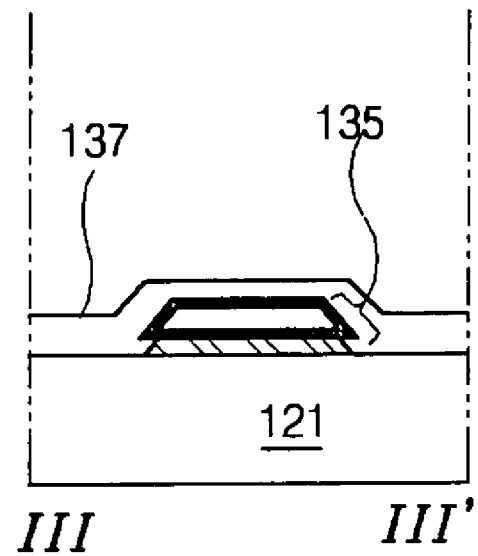
Figure 8E:
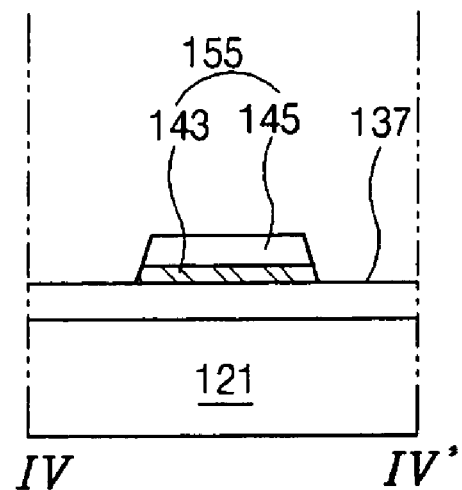

The third and fourth metal layers 143 and 145 are thereafter simultaneously patterned through an etching process. Thus, as shown in FIGS. 6E, 7E and 8E, a source electrode 149, a drain electrode 151, a data line 153, a data pad electrode 155 and a capacitor electrode 157, each of which has the double-layered structure, are formed over the substrate 121. Although not shown in FIGS. 6E, 7E and 8E, the source electrode 149 extends from the data line 153 and contacts one portion of the ohmic contact layer 141. The drain electrode 151 is spaced apart from the source electrode 149 across the gate electrode 131, and contacts the other portion of the ohmic contact layer 141. As mentioned before, the data pad electrode 155 is adjacent to the end of the data line 153, and the capacitor electrode 157 is shaped like an island and disposed above a portion of the gate line 133.

Figure 6F:
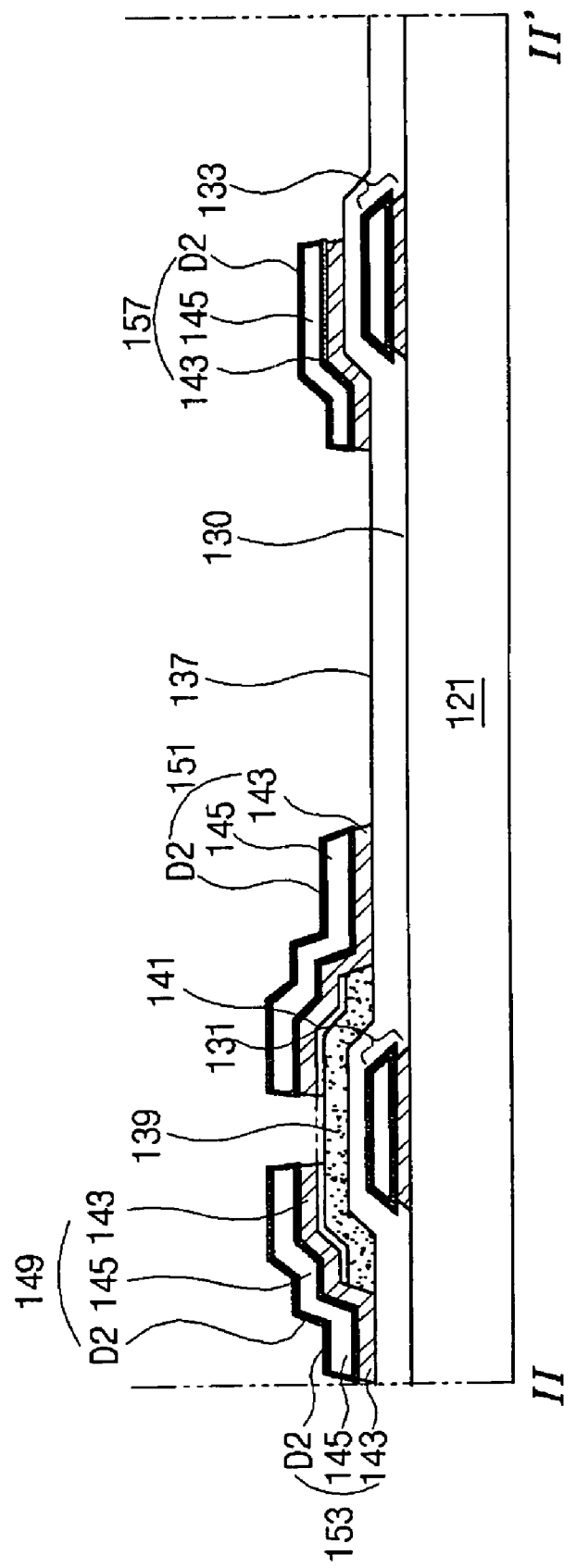
Figure 7F:
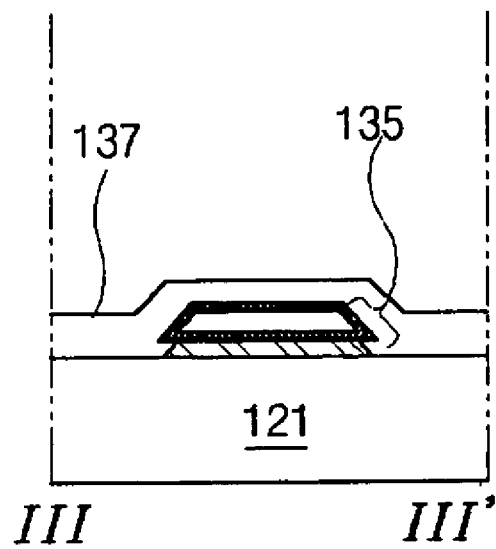
Figure 8F:
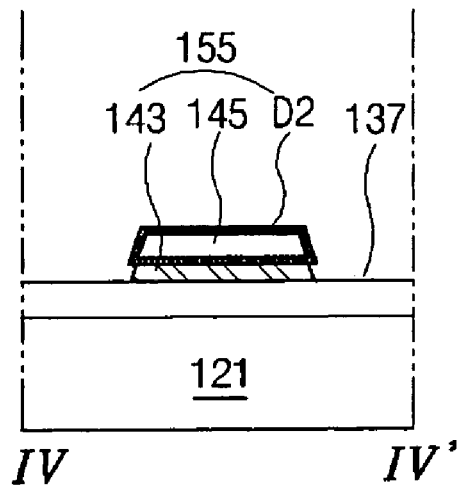

Referring to FIGS. 6F, 7F and 8F, the double-layered source electrode 149, drain electrode 151, data line 153, data pad electrode 155 and capacitor electrode 157, and the substrate 121 underneath, is additionally heat-treated at a temperature of more than 200 decrees Celsius, in a process similar to the formation of the first out-diffusion film D1. Accordingly, a second out-diffusion film D2 having a thickness of 1 to 100 angstroms is formed. The second out-diffusion film D2 surrounds all surfaces of the copper alloy layer 145. During the heat treatment, the molybdenum from the molybdenum (or molybdenum alloy) layer 143 diffuses on all of surfaces of the Cu alloy layer 145, and reacts with copper from the Cu alloy layer 145. The resulting second out-diffusion film D2 is a compound metal film of molybdenum and copper. As shown in FIGS. 6F and 8F, the second out-diffusion film D2 completely covers and surrounds all the surfaces of the Cu alloy layer 145. Further, since molybdenum is alloyed with copper, the second out-diffusion film D2 is interposed between the molybdenum (or molybdenum alloy) layer 143 and the Cu alloy layer 145. In embodiments of the present invention, the second out-diffusion film D2 enhances the adhesion of an insulator that is formed thereon in a later processing step. Moreover, the fourth metal layer 145 may include copper (Cu) and at least another metal which is one of titanium (Ti), tantalum (Ta), chromium (Cr), nickel (Ni), neodymium (Nd), indium (In), aluminum (Al) layer, and an alloy of thereof. Before or after the heat treatment, a portion of the ohmic contact layer 141 between the source and drain electrodes 149 and 151 is removed to form a channel region on the active layer 139 using the source and drain electrodes 149 and 151 as masks.

Figure 6G:
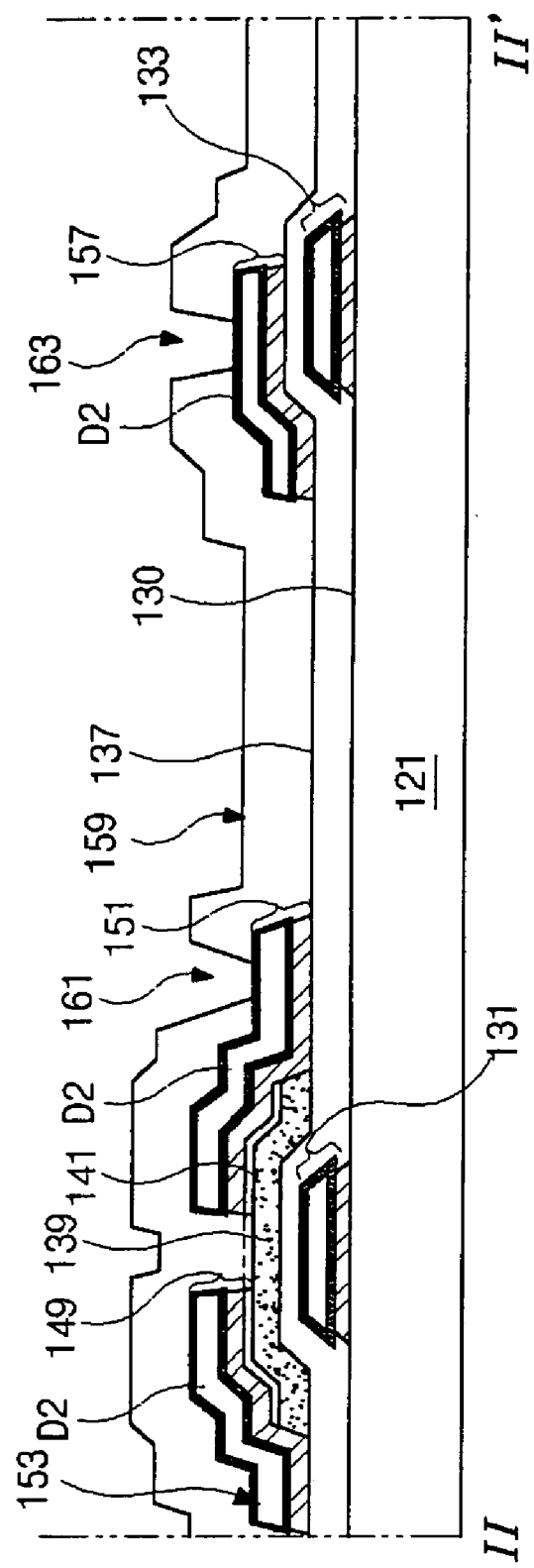
Figure 7G:
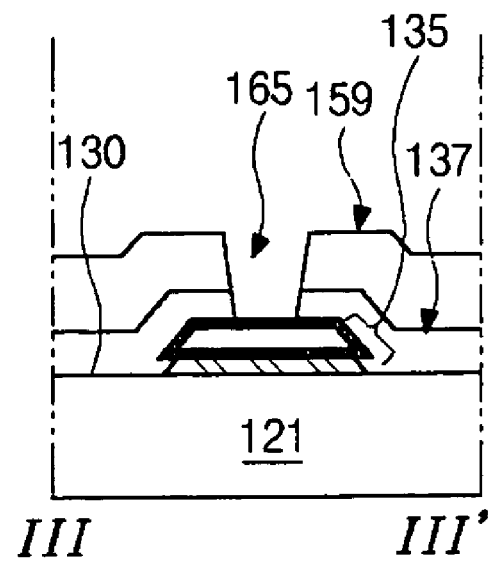
Figure 8G:
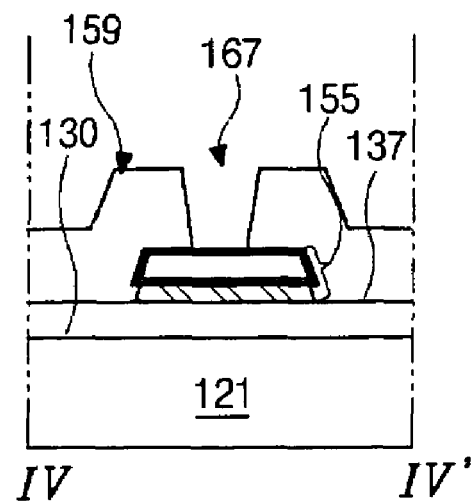

Referring to FIGS. 6G, 7G and 8G, a passivation layer 159, which is a second insulating layer, is formed over the entire substrate 121. The passivation layer 159 covers the source and drain electrodes 149 and 151, the data line 153, the data pad electrode 155 and the storage capacitor 157. Contact holes are formed by patterning the passivation layer 159. The contact holes include a drain contact hole 161, a storage contact hole 163, a gate pad contact hole 165, and a data pad contact hole 167. The drain contact hole 161 exposes a portion of the drain electrode 151. The storage contact hole 163 exposes a portion of the capacitor electrode 157. The gate pad contact hole 165 exposes a portion of the gate pad 135. The data pad contact hole 167 exposes a portion of the data pad 155. In embodiments of the present invention, the gate pad contact hole 165 exposes the first out-diffusion film D1. The drain, storage and data pad contact holes 161, 163 and 167 expose the second out-diffusion films D2. An inorganic material, such as silicon oxide ($SiO_2$) or silicon nitride ($SiN_x$), or an organic material, such as benzocyclobutene (BCB) or acrylic resin, or double layers thereof may be used as a material for the passivation layer 159.

Figure 6H:
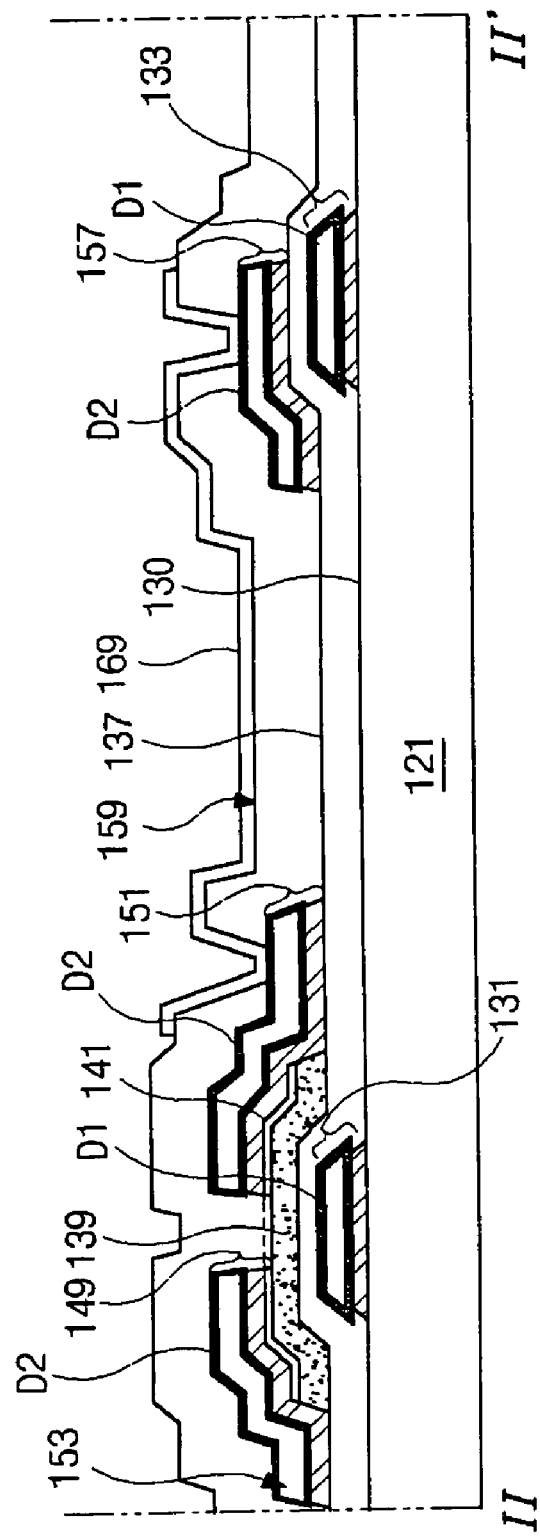
Figure 7H:
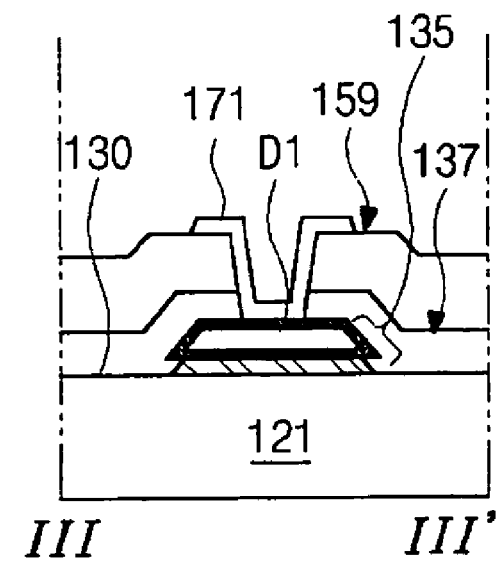
Figure 8H:
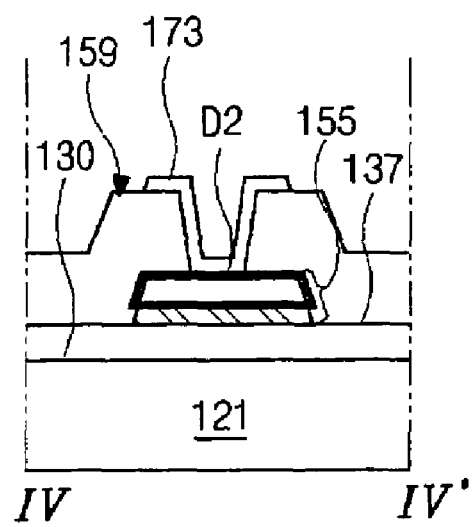

Referring to FIGS. 6H, 7H and 8H, a transparent conductive material is deposited on the passivation layer 159 with the above-mentioned holes. The transparent conductive material is patterned to form a pixel electrode 169, a gate pad terminal 171 and a data pad terminal 173. The transparent conductive material may be one of indium tin oxide (ITO) and indium zinc oxide (IZO). The pixel electrode 169 contacts the drain electrode 151 and the capacitor electrode 157, respectively, through the drain contact hole 161 and storage contact hole 163. Further, the gate pad terminal 171 contacts the gate pad electrode 135 through the gate pad contact hole 165. The data pad terminal 173 contacts the data pad electrode 155 through the data pad contact hole 167. Accordingly, the array substrate of the present invention is complete.

In the above-mentioned embodiment of the present invention, since copper (Cu), which has a low electrical resistance, is used in the gate electrode, the source and drain electrodes and the gate and data lines, the array substrate can have superior operating characteristics. For example, the thin film transistor can become a good array element in the array substrate. Furthermore, since the gate and data lines include copper, which has a low electrical resistance, signal delays are reduced or prevented in those lines. Therefore, a large LCD device incorporating such a structure, including the out-diffusion films, can display a higher quality image.

Figure 9A:
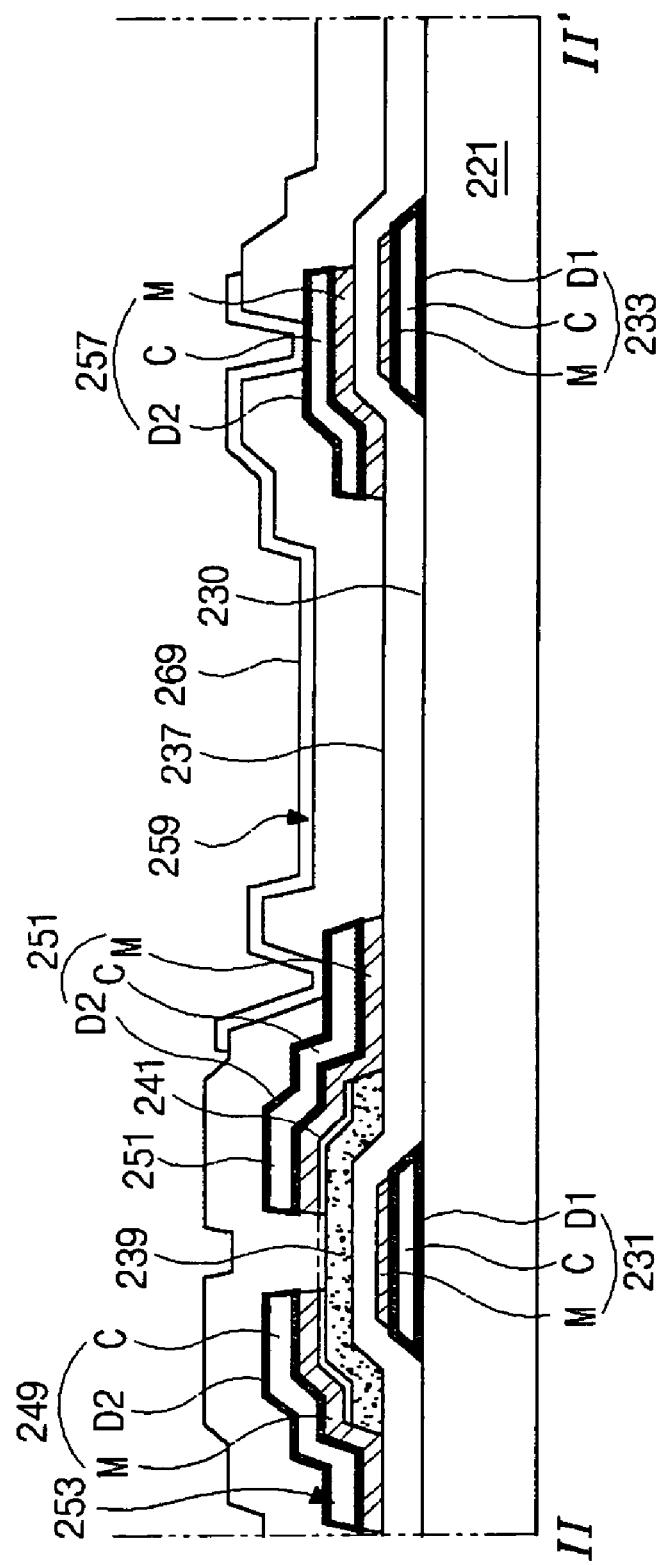
FIGS. 9A-9C are cross-sectional views of an exemplary modified process for fabricating an array substrate according to another embodiment of the present invention.
Figure 9B:
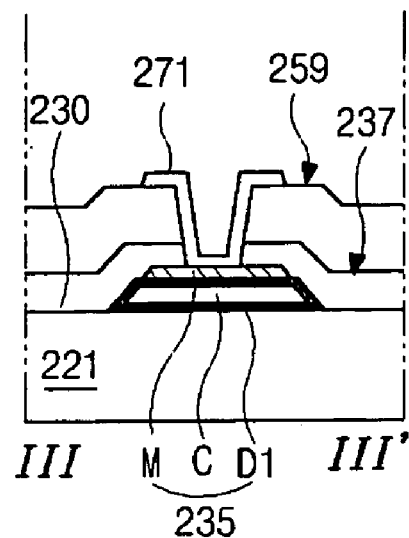
Figure 9C:
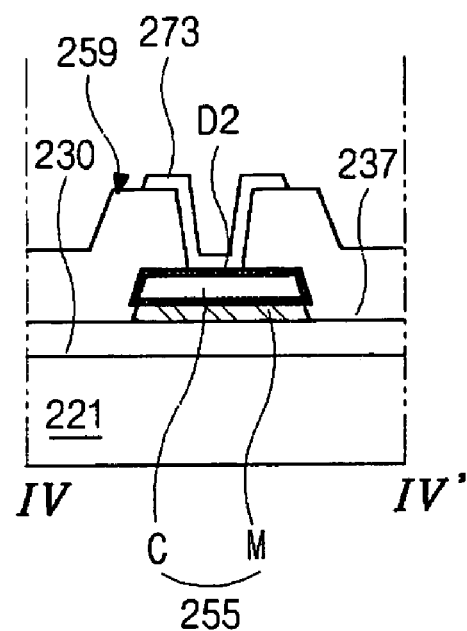

FIGS. 9A-9C are cross-sectional views of an exemplary modified process for fabricating an array substrate according to another embodiment of the present invention. Referring to FIGS. 9A-9C, in contrast to the previous embodiment of the present invention, the formation of the molybdenum (Mo) layer M follows the formation of the copper (Cu) layer C. Specifically, the copper alloy layer C is first formed on the substrate 121. Subsequently, the molybdenum (Mo) is formed on the copper (Cu) layer C.

As shown in FIGS. 9A-9C, a gate electrode 231, a gate line 233 and a gate pad electrode 235 are formed on a substrate 221. The gate electrode 231, gate line 233 and pad electrode 235 have a double-layered structure consisting of a first metal C of copper alloy (Cu alloy) and a second metal M of molybdenum (Mo). As set forth above, the Cu alloy layer C may include copper (Cu) and at least one of tantalum (Ta), titanium (Ti), aluminum (Al), neodymium (Nd), chromium (Cr), tungsten (W), nickel (Ni), and an alloy thereof. Unlike the previously-described embodiment of the present invention, the copper alloy layer C is first formed on the substrate 221, and the molybdenum (or molybdenum alloy) layer M is disposed on the copper alloy layer C. A first out-diffusion film D1 is formed surrounding all the surfaces of the copper alloy layer C by applying heat treatment to the substrate 221 including the double-layered gate electrode 231, gate line 233 and pad electrode 235. The first out-diffusion film D1 is interposed between the molybdenum (or molybdenum alloy) layer M and the copper alloy layer C. In this embodiment of the present invention, the first out-diffusion film D1 is also formed between the substrate 221 and the copper alloy layer C, thus improving the adhesiveness of the copper alloy C to the substrate 221.

The gate electrode 231 extends from the gate line 233 and the gate pad electrode 235 is adjacent to the end of the gate line 233. In this embodiment of the present invention, the copper alloy and molybdenum (or molybdenum alloy) layers C and M are sequentially and stably formed on the substrate 221, thus forming the double layered gate electrode 231, gate line 233 and pad electrode 235 including the first out-diffusion film D1 that is interposed between the substrate 221 and the copper alloy layer C.

A gate insulation layer 237 is formed on the substrate 221 following the formation of the first out-diffusion film D1. The gate insulation layer 237 covers the gate electrode 231, gate line 233 and pad electrode 235. The gate insulation layer 237 may be an inorganic material, such as silicon nitride ($SiN_X$) or silicon oxide ($SiO_2$). Thereafter, an active layer 239 of amorphous (a-Si:H) and an ohmic contact layer 241 of $n^+$ doped amorphous silicon ($n^+$a-Si:H) are sequentially formed on the gate insulation layer 237, especially over the gate electrode 131.

Next, a source electrode 249, a drain electrode 251, a data line 253, a data pad electrode 255 and a capacitor electrode 257, each of which has a double-layered structure, are formed over the substrate 221. Each of the source electrode 249, the drain electrode 251, the data line 253, the data pad electrode 255 and the capacitor electrode 257 has a molybdenum (or molybdenum alloy) layer M, a copper alloy layer C and a second out-diffusion film D2. The second out-diffusion film D2 is formed on all of the surfaces of the copper alloy layer C by applying the heat treatment.

The source electrode 249 extends from the data line 253 and contacts the ohmic contact layer 241. The drain electrode 251 is spaced apart from the source electrode 249 and also contacts the ohmic contact layer 241. The data pad electrode 255 is adjacent to the end of the data line 253. The capacitor electrode 257 is shaped like an island and disposed above the gate line 233. After forming the source and drain electrodes 249 and 251, a portion of the ohmic contact layer 241 is removed to form a channel region between the source and drain electrodes 249 and 251.

Still referring to FIGS. 9A, 9B and 9C, a passivation layer 259, which is an insulation material, is formed over the entire substrate 221. The passivation layer 259 covers the source and drain electrodes 249 and 251, the data line 253, the data pad electrode 255 and the storage capacitor 257. The passivation layer 259 has contact holes, which expose portions of the drain electrode 251, the capacitor electrode 257, the gate pad 235, and the data pad 255, respectively. An inorganic material, such as silicon oxide ($SiO_2$) or silicon nitride ($SiN_X$), or an organic material, such as benzocyclobutene (BCB) or acrylic resin, or double layers thereof may be used to form the passivation layer 259.

After forming the passivation layer 259 including the contact holes, a transparent conductive material is deposited on the passivation layer 259. The transparent conductive material is patterned to form a pixel electrode 269, a gate pad terminal 271 and a data pad terminal 273. The transparent conductive material is one of indium tin oxide (ITO) and indium zinc oxide (IZO). The pixel electrode 269 contacts the drain electrode 251 and the capacitor electrode 257, respectively, through the contact holes. Further, the gate pad terminal 271 contacts the gate pad 235, and the data pad terminal 273 contacts the data pad 255. Accordingly, the array substrate of the second embodiment is complete.

In the second exemplary embodiment of the present invention, the double layered gate electrode 231, gate line 233 and pad electrode 235 can be adhere firmly and stably to the substrate 221 because the first out-diffusion film D1 is formed between the substrate 221 and the copper alloy layer C while surrounding the copper alloy layer C.

Accordingly, the embodiments of the present invention have the following advantages. First, the thin film transistor have improved characteristics because the copper alloy layer of the source and drain electrodes do not contact the active layer and/or the ohmic contact layer, unlike the related art which uses aluminum. Second, adhesion between the copper alloy layer and the insulator and/or between the copper alloy layer and the substrate is dramatically increased because of the diffusion of molybdenum on the surface of the copper alloy layer during the heat treatment process. Third, the size of the array substrate increased without suffering significant signal delays, as with the related art, because copper (Cu), which has a low resistance, is used for the lines and electrodes. Fourth, the fabrication process time can be reduced because both the copper alloy and molybdenum layers of the double-layered metal layer are simultaneously etched by the same etching solution.

It will be apparent to those skilled in the art that various modifications and variations can be made in the array substrate for LCD device having double-layered metal structure, and the manufacturing method thereof, of the present invention without departing from the spirit or scope of the invention. Thus, it is intended that the present invention cover the modifications and variations of this invention provided they come within the scope of the appended claims and their equivalents.

What is claimed is:

1. An array substrate for a liquid crystal display device, comprising:

a gate electrode, a gate line and a gate pad electrode disposed on a substrate, each of the gate electrode, the gate line and the gate pad electrode having a first metal barrier layer, a first copper alloy layer, and a first out-diffusion film, and the first out-diffusion film completely covering, surrounding and contacting entire surfaces of the first copper alloy layer;

a gate insulation layer disposed on the substrate and covering the gate electrode, the gate line and the gate pad electrode;

an active layer and an ohmic contact layer sequentially formed on the gate insulation layer and over the gate electrode;

a data line formed on the gate insulation layer and perpendicularly crossing the gate line;

a source electrode and a drain electrode contacting the ohmic contact layer;

a data pad electrode disposed on the gate insulation layer;

a passivation layer formed on the gate insulation layer, the passivation layer covering the data line, the source electrode, the drain electrode and the data pad electrode, and the passivation layer having a plurality of contact holes, including a drain contact hole that exposes a portion of the drain electrode, a gate pad contact hole that exposes a portion of the gate pad electrode, and a data pad contact hole that exposes a portion of the data pad electrode; and a pixel electrode, a gate pad terminal and a data pad terminal, each of which is formed on the passivation layer, and each of which includes a transparent conductive material.

2. The array substrate according to claim 1, wherein each of the data line, the source and drain electrodes, and the data pad electrode includes a second metal barrier layer, a second copper alloy layer, and a second out-diffusion film.

3. The array substrate according to claim 2, wherein the second out-diffusion film covers, surrounds and contacts entire surfaces of the second copper alloy layer.

4. The array substrate according to claim 2, wherein the first and second metal barrier layers include molybdenum.

5. The array substrate according to claim 2, wherein each of the first and second copper alloy layers is a compound metal that includes copper (Cu) and at least one of titanium (Ti), tantalum (Ta), chromium (Cr), nickel (Ni), neodymium (Nd), indium (In) and aluminum (Al).

6. The array substrate according to claim 5, wherein the compound metal for the first and second copper alloy layers includes less than 5% of the at least one of titanium (Ti), tantalum (Ta), chromium (Cr), nickel (Ni), neodymium (Nd), indium (In) and aluminum (Al).

7. The array substrate according to claim 2, wherein the first and second out-diffusion films are compound metal films of molybdenum and copper.

8. The array substrate according to claim 2, wherein each of the first and second out-diffusion films has a thickness ranging from 1 to 100 angstroms.

9. The array substrate according to claim 1, wherein the first metal barrier layer is disposed on a surface of the substrate, the first copper alloy layer is disposed over the first metal barrier layer, and the first out-diffusion film is disposed on the entire surfaces of the first copper alloy layer and interposed between the first metal barrier layer and the first copper alloy layer.

10. The array substrate according claim 1, wherein the first copper alloy layer is disposed over the substrate, the first metal barrier layer is disposed over the first copper alloy layer, and the first out-diffusion film is disposed on the entire surfaces of first copper alloy layer and interposed between the substrate and the first copper alloy layer.

11. The array substrate according to claim 1, wherein the gate electrode extends from the gate line, the gate pad electrode is adjacent to an end of the gate line, the source electrode extends from the data line, the drain electrode is spaced apart from the source electrode, and the data pad electrode is adjacent to an end of the data line.

12. The array substrate according to claim 1, wherein the pixel electrode is disposed in a pixel region defined by a crossing of the gate and data lines.

13. The array substrate according to claim 1, wherein the pixel electrode contacts the drain electrode through the drain contact hole, the gate pad terminal contacts the gate pad through the gate pad contact hole, and the data pad terminal contacts the data pad through the data pad contact hole.

14. The array substrate according to claim 1, further comprising a storage capacitor including:

a first electrode which includes a portion of the gate line;
a dielectric layer which includes the gate insulating layer; and
a capacitor electrode on the gate insulating layer and over the portion of the gate line,
wherein the capacitor electrode has a second metal barrier layer, a second copper alloy layer, and a second out-diffusion film that covers, surrounds and contacts the entire surfaces of the second copper alloy layer; and
wherein the capacitor electrode is connected in parallel with the pixel electrode through a contact hole formed in the passivation layer.

15. A method of forming an array substrate for a liquid crystal display device, comprising:

forming a gate electrode, a gate line and a gate pad electrode on a substrate, each of the gate electrode, the gate line and the gate pad electrode including a first metal barrier layer and a first copper alloy layer arranged in a first double-layered structure;

applying heat to the gate electrode, the gate line and the data pad electrode, thereby forming a first out-diffusion film covering, surrounding and contacting entire surfaces of the first copper alloy layer corresponding to each of the gate electrode, the gate line and the data pad electrode;

forming a gate insulation layer on the substrate, the gate insulation layer covering the gate electrode, the gate line and the gate pad electrode including the first metal barrier layer, the first copper alloy layer and the first out-diffusion film corresponding to each of the gate electrode, the gate line and the gate pad electrode;

sequentially forming an active layer and an ohmic contact layer on the gate insulation layer and over the gate electrode;

forming a data line, a source electrode, a drain electrode and a data pad electrode, such that the data line is disposed on the gate insulation layer and crosses the gate line, the source electrode and the drain electrode contact the ohmic contact layer, the data pad electrode is disposed on the gate insulation layer, and each of the data line, the source and drain electrodes, the data pad electrode includes a second metal barrier layer and a second copper alloy layer arranged in a second double-layered structure;

forming a second out-diffusion film by applying heat to the data line, the source electrode, the drain electrode and the data pad electrode, the second out-diffusion film covering, surrounding and contacting the second copper alloy layer in each of the data line, the source electrode, the drain electrode and the data pad electrode;

forming a passivation layer on the gate insulation layer to cover the data line, the source electrode, the drain electrode and the data pad electrode, including the second metal barrier layer, the second copper alloy layer and the second out-diffusion film corresponding to each of which, such that the passivation layer includes a plurality of contact holes, including a drain contact hole that exposes the drain electrode, a gate pad contact hole that exposes the gate pad electrode, and a data pad contact hole that exposes the data pad electrode; and forming a pixel electrode, a gate pad terminal and a data pad terminal on the passivation layer using a transparent conductive material.

16. The method according to claim 15, the first and second metal barrier layers includes molybdenum.

17. The method according to claim 15, wherein each of the first and second copper alloy layers is a compound metal that includes copper and at least one of titanium (Ti), tantalum (Ta), chromium (Cr), nickel (Ni), neodymium (Nd), indium (In) and aluminum (Al).

18. The method according to claim 17, wherein the compound metal for the first and second copper alloy layers includes less than 5% of the at least one of titanium (Ti), tantalum (Ta), chromium (Cr), nickel (Ni), neodymium (Nd), indium (In) and aluminum (Al).

19. The method according to claim 15, wherein the first and second out-diffusion films are alloy metal films of molybdenum and copper formed at a temperature higher than 200 degrees Celsius.

20. The method according to claim 15, wherein each of the first and second out-diffusion films has a thickness ranging from 1 to 100 angstroms.

21. The method according to claim 15, wherein the first metal barrier layer is disposed on a surface of the substrate, the first copper alloy layer is disposed over the first metal barrier layer, and the first out-diffusion film is disposed on the entire surfaces of the first copper alloy layer and interposed between the first metal barrier layer and the first copper alloy layer.

22. The method according claim 15, wherein the first copper alloy layer is over the substrate, the first metal barrier layer is over the first copper alloy layer, and the first out-diffusion film is disposed on the entire surfaces of first copper alloy layer and interposed between the substrate and the first copper alloy layer.

23. The method according to claim 15, wherein the gate electrode extends from the gate line, the gate pad electrode is adjacent to an end of the gate line, the source electrode extends from the data line, the drain electrode is spaced apart from the source electrode, and the data pad electrode is adjacent to an end of the data line.

24. The method according to claim 15, wherein the pixel electrode is disposed in a pixel region defined by a crossing of the gate and data lines.

25. The method according to claim 15, wherein the pixel electrode contacts the drain electrode through the drain contact hole, the gate pad terminal contacts the gate pad through the gate pad contact hole, and the data pad terminal contacts the data pad through the data pad contact hole.

26. The method according to claim 15, wherein forming the data line, the source and drain electrodes and the data pad electrode includes forming a double-layered capacitor electrode on the gate insulating layer and over the portion of the gate line.

27. The method according to claim 26, wherein the double-layered capacitor electrode includes the second metal barrier layer and the second copper alloy layer.

28. The method according to claim 27, wherein applying heat to the data line, source and drain electrode and data pad electrode includes applying the heat to the double-layered capacitor electrode to form a second out-diffusion film that covers, surrounds and come in contact with the second copper alloy layer.

29. The method according to claim 26, wherein the capacitor electrode is connected in parallel with the pixel electrode through a contact hole formed in the passivation layer.

30. A method of forming an array substrate for a liquid crystal display device, comprising:

forming a double-layered electrode, which is one of a gate electrode, a gate line and a gate pad electrode on a substrate, such that the double-layered electrode includes a first metal barrier layer and a first copper alloy layer arranged in a first double-layered structure;

applying heat to the double-layered electrode, thereby forming a first out-diffusion film covering, surrounding and contacting entire surfaces of the first copper alloy layer;

forming a gate insulation layer on the substrate, the gate insulation layer covering the double-layered electrode including the first metal barrier layer, the first copper alloy layer and the first out-diffusion film;

sequentially forming an active layer and an ohmic contact layer on the gate insulation layer and over the gate electrode;

forming a data line, a source electrode, a drain electrode and a data pad electrode, such that the data line is disposed on the gate insulation layer and crosses the gate line, the source electrode and the drain electrode contact the ohmic contact layer, the data pad electrode is disposed on the gate insulation layer, and one of the data line, the source and drain electrodes, the data pad electrode includes a second metal barrier layer and a second copper alloy layer arranged in a second double-layered structure;

forming a second out-diffusion film by applying heat to the one of the data line, the source electrode and the drain electrode and the data pad electrode that includes the second double-layered structure, the second out-diffusion film covering, surrounding and contacting the second copper alloy layer;

forming a passivation layer on the gate insulation layer to cover the data line, the source electrode, the drain electrode and the data pad electrode, including the second metal barrier layer, the second copper alloy layer and the second out-diffusion film, such that the passivation layer includes a plurality of contact holes, including a drain contact hole that exposes the drain electrode, a gate pad contact hole that exposes the gate pad electrode, and a data pad contact hole that exposes the data pad electrode; and forming a pixel electrode, a gate pad terminal and a data pad terminal on the passivation layer using a transparent conductive material.

* * * * *